(12) United States Patent
Park et al.

(10) Patent No.: US 8,377,817 B2
(45) Date of Patent: Feb. 19, 2013

(54) THREE DIMENSIONAL SEMICONDUCTOR MEMORY DEVICE AND METHOD OF MANUFACTURING THE SAME

(75) Inventors: Chanjin Park, Yongin-si (KR); Kihyun Hwang, Seongnam-si (KR); Dongchul Yoo, Seongnam-si (KR); Junkyu Yang, Seoul (KR); Gyungjin Min, Seongnam-si (KR); Yoochul Kong, Seoul (KR); Hanmei Choi, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 46 days.

(21) Appl. No.: 13/173,304

(22) Filed: Jun. 30, 2011

(65) Prior Publication Data

US 2012/0001345 A1 Jan. 5, 2012

(30) Foreign Application Priority Data

Jul. 5, 2010 (KR) .................. 10-2010-0064411

(51) Int. Cl.
*H01L 21/4763* (2006.01)
(52) U.S. Cl. ........ 438/618; 438/637; 438/694; 438/740; 257/E23.145; 257/E21.677
(58) Field of Classification Search .................. 438/156, 438/588, 598, 618, 637, 694, 740; 257/E23.145, 257/E21.677
See application file for complete search history.

(56) References Cited

U.S. PATENT DOCUMENTS

| | | | | |
|---|---|---|---|---|
| 7,539,056 | B2 * | 5/2009 | Katsumata et al. | 365/185.18 |
| 7,558,141 | B2 * | 7/2009 | Katsumata et al. | 365/210.1 |
| 7,972,955 | B2 * | 7/2011 | Choi et al. | 438/618 |
| 2008/0067583 | A1 * | 3/2008 | Kidoh et al. | 257/326 |
| 2009/0310415 | A1 | 12/2009 | Jin et al. | |
| 2009/0310425 | A1 * | 12/2009 | Sim et al. | 365/185.29 |
| 2010/0038703 | A1 * | 2/2010 | Fukuzumi et al. | 257/326 |
| 2010/0078701 | A1 | 4/2010 | Shim et al. | |
| 2010/0133599 | A1 * | 6/2010 | Chae et al. | 257/315 |
| 2010/0327323 | A1 * | 12/2010 | Choi | 257/202 |
| 2011/0092038 | A1 | 4/2011 | Choi et al. | |
| 2011/0147801 | A1 | 6/2011 | Shim et al. | |
| 2011/0180941 | A1 | 7/2011 | Hwang et al. | |
| 2011/0186851 | A1 | 8/2011 | Son et al. | |
| 2011/0199804 | A1 | 8/2011 | Son et al. | |

* cited by examiner

*Primary Examiner* — Jarrett Stark
*Assistant Examiner* — John M Parker
(74) *Attorney, Agent, or Firm* — F. Chau & Associates, LLC

(57) ABSTRACT

Provided is a three dimensional semiconductor device. The device may include mold layers vertically and sequentially stacked, a conductive pattern between the stacked mold layers, a plugging pattern vertically penetrating the stacked mold layers, an intermediate pattern between the conductive pattern and the plugging pattern, and protective layer patterns between the mold layers and the plugging pattern, wherein the protective layer patterns are separated by the intermediate pattern.

10 Claims, 40 Drawing Sheets

THREE DIMENSIONAL SEMICONDUCTOR MEMORY DEVICE AND METHOD OF MANUFACTURING THE SAME

CROSS-REFERENCE TO RELATED APPLICATIONS

This U.S. non-provisional patent application claims priority under 35 U.S.C. §119 to Korean Patent Application No. 10-2010-0064411, filed on Jul. 5, 2010, the entire contents of which are incorporated by reference herein.

BACKGROUND

The embodiments of the present inventive concept are directed to a semiconductor device, and more particularly, to a three dimensional semiconductor memory device including memory cells arranged in three dimensions.

Memory devices including nonvolatile memory devices that are widely used have heretofore been of the planar (2-dimensional) type. Memory devices that have memory cells structured in 3-dimensions (e.g., memory cells that have adjacent cells horizontally in two axes plus vertically) would have higher capacity. A 3D memory fabrication process is a punch-and-plug, which includes a process of penetrating plural layers sequentially formed on a substrate.

SUMMARY

An embodiment of the inventive concept provides a method of manufacturing a three dimensional semiconductor device. The method may include forming a first opening vertically penetrating mold layers and a sacrificial layer between the mold layers, sequentially forming a protective layer and a plugging layer on an inner wall of the first opening, forming a second opening vertically the penetrating mold layers and the sacrificial layer, the second opening being spaced apart from the first opening, forming a recess region exposing the protective layer by removing the sacrificial layer exposed by the second opening, and exposing the plugging layer by removing the protective layer exposed by the recess region.

An embodiment of the inventive concept provides a three dimensional semiconductor device. The three dimensional semiconductor device may include mold layers vertically and sequentially stacked, a conductive pattern between the mold layers, a plugging pattern vertically penetrating the mold layers, an intermediate pattern between the conductive pattern and the plugging pattern, and protective layer patterns between the mold layers and the plugging pattern wherein the protective layer patterns are separated by the intermediate pattern.

An embodiment of the inventive concept provides a method of manufacturing a three dimensional semiconductor device comprising forming a first opening in mold layers and sacrificial layers that are alternately arranged, sequentially forming a protective layer and a plugging layer on an inner wall of the first opening, forming a second opening in the mold layers and the sacrificial layer, wherein the second opening is spaced apart from the first opening, selectively removing the sacrificial layers to expose the protective layer, and selectively removing the protective layer to expose the plugging layer.

BRIEF DESCRIPTION OF THE FIGURES

The accompanying figures are included to provide a further understanding of the present inventive concept, and are incorporated in and constitute a part of this specification. The drawings illustrate exemplary embodiments of the present inventive concept and, together with the description, serve to explain principles of the present inventive concept. In the figures.

DETAILED DESCRIPTION OF THE EMBODIMENTS

Figure 1:
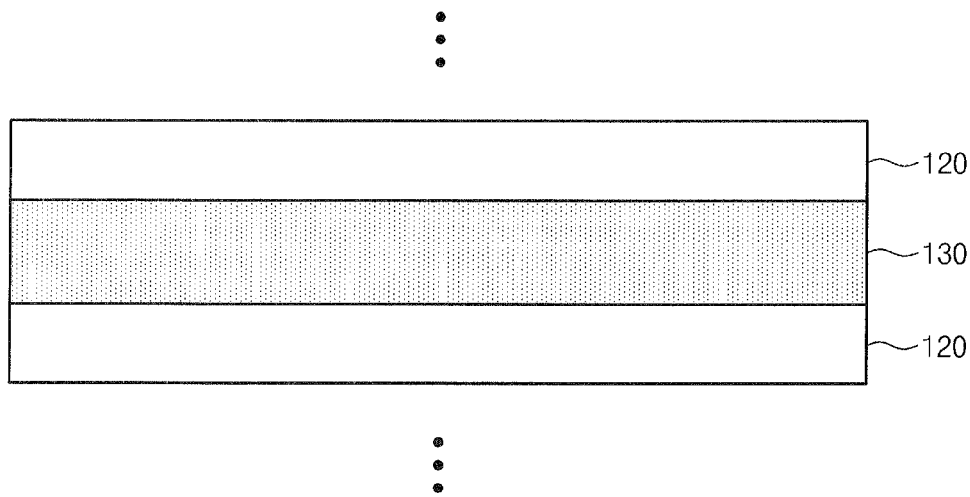
FIGS. 1 through 5 are cross-sectional views illustrating a method of a three dimensional semiconductor device according to an embodiment of the inventive concept.

Exemplary embodiments of the inventive concepts will now be described in more detail with reference to the accompanying drawings, wherein like reference numerals may be used to denote like or similar elements throughout the drawings and the specification.

A three-dimensional semiconductor device according to an exemplary embodiment of the inventive concept may include a cell array region, a peripheral circuit region, a sense amp region, a decoding circuit region, and a connection region. A plurality of memory cells and bit lines and word lines for electrical connection to the plurality of memory cells may be located in the cell array region. Circuits for driving the plurality of memory cells may be located in the peripheral circuit region, and circuits for reading information stored in the plurality of memory cells may be located in the sense amp region. The connection region may be positioned between the cell array region and the decoding circuit region, and a wiring structure for electrically connecting the word lines with the decoding circuit region may be positioned between the word lines and the decoding region.

Hereinafter, technical features related to a part of a cell array region of a three-dimensional device will be described. In addition, U.S. patent application Ser. Nos. 12/953,748, filed on Nov. 24, 2010, 12/981,625, filed on Dec. 30, 2010, 13/012,485, filed on Jan. 24, 2011, 12/901,025, filed on Oct. 8, 2010, and 12/480,399, filed on Jun. 8, 2009, may disclose technical features related to the cell array region and other regions (e.g., a peripheral region or a connection region). The entire contents disclosed in U.S. patent application Ser. Nos. 12/953,748, 12/981,625, 13/012,485, 12/901,025, and 12/480,399 are incorporated by reference herein.

Furthermore, U.S. patent application Ser. No. 13/012,485, the disclosure of which is incorporated by reference in its entirety herein, may disclose a multi-layered memory structure obtained by repeatedly forming a memory structure. For example, in some embodiments of the inventive concept, a multilayered memory structure may be formed by repeatedly stacking a memory structure, which will be explained in the following description, using ways disclosed in the U.S. patent application Ser. No. 13/012,485.

Figure 6:
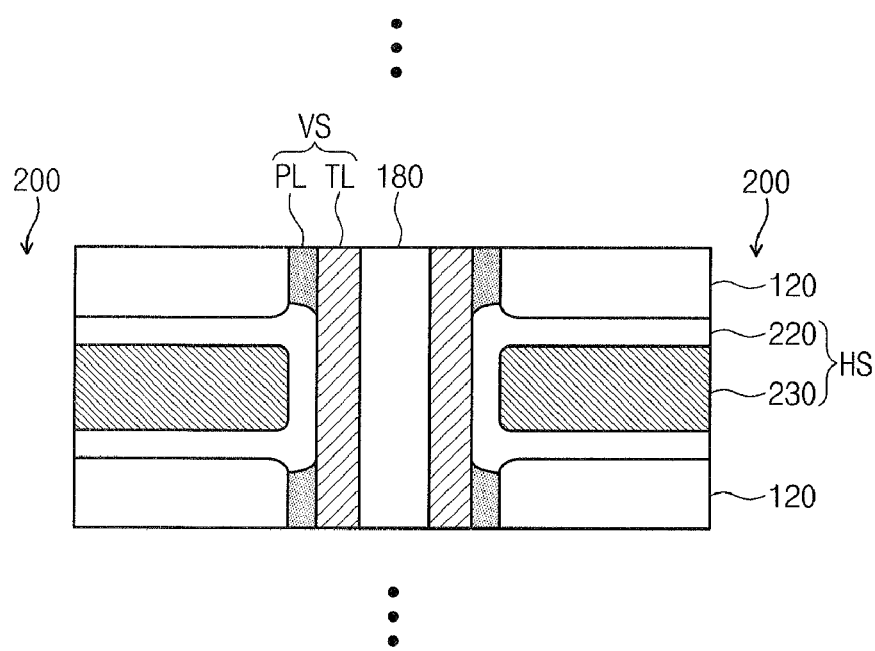
FIGS. 6 through 8 are cross-sectional views illustrating a method of a three dimensional semiconductor device according to embodiments of the inventive concept.
Figure 7:
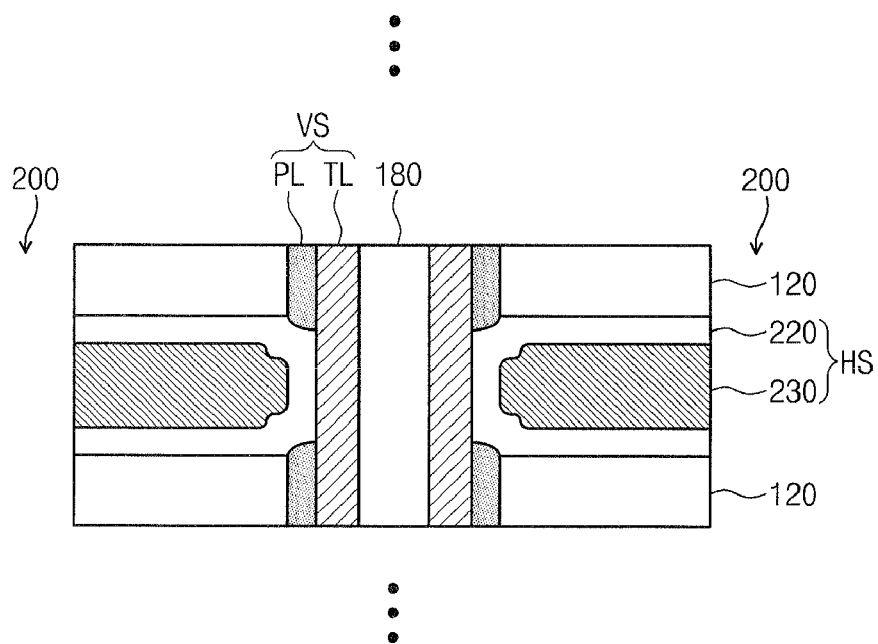
Figure 8:
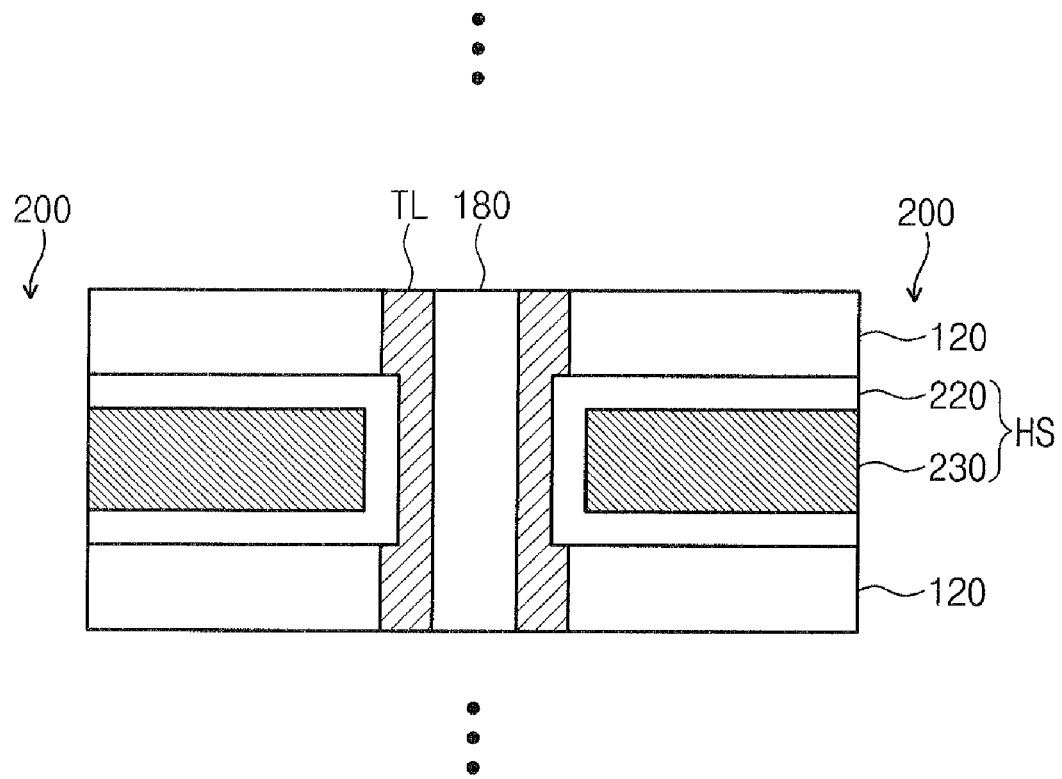

FIGS. 1 through 5 are cross-sectional views illustrating a method of fabricating a three dimensional semiconductor device according to an embodiment of the inventive concept. FIGS. 6 through 8 are cross-sectional views illustrating a three dimensional semiconductor device according to embodiments of the inventive concept.

Referring to FIG. 1, mold layers 120 and sacrificial layers 130 are sequentially and alternately disposed on a substrate (not illustrated). As a result, as illustrated in FIG. 1, the sacrificial layers 130 may be each interposed between two neighboring mold layers 120 vertically stacked.

The sacrificial layers 130 may be formed of a material having an etch selectivity to the mold layer 120. For example, the sacrificial layer 130 may be formed of a material that can be removed while substantially preventing the mold layer 120 from being etched during an etching process using a predetermined etch recipe. For example, according to an embodiment, if the mold layer 120 is a silicon oxide layer, the sacrificial layer 130 may be a silicon nitride layer. For example, according to an embodiment, an etch selectivity between thin selected layer a and unselected b may be quantitatively represented as a rate of etch speeds of the layers a and b. As used herein, the phrase "have an etch selectivity" means that a difference in etch speed between selected and unselected layers is sufficiently great.

Figure 2:
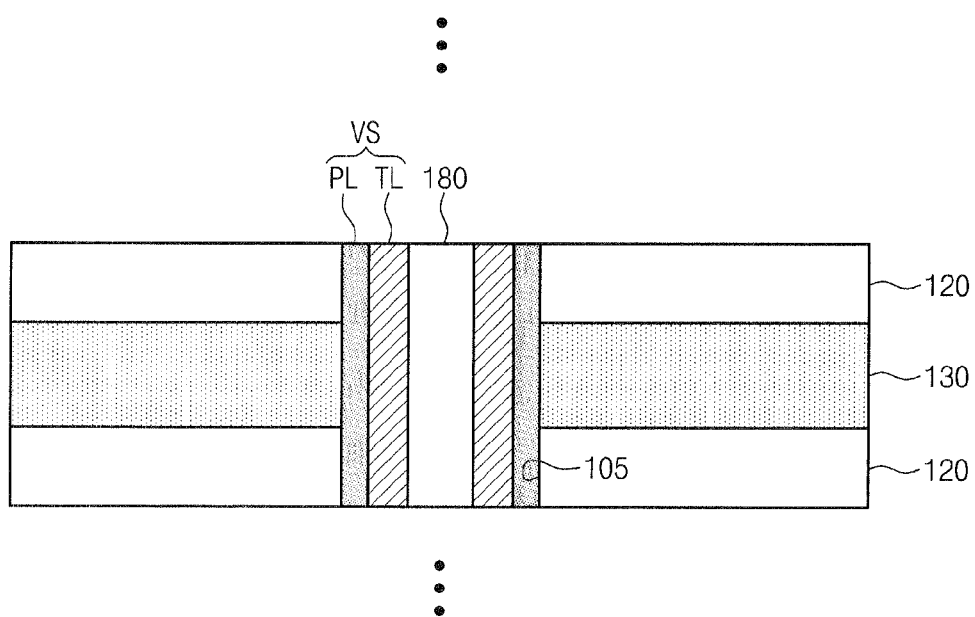

Referring to FIG. 2, after forming an opening 105 (or a first opening) penetrating the mold layers 120 and the sacrificial layers 130, a protective layer PL and a plugging layer TL are sequentially formed to cover an inner sidewall of the opening 105. According to an embodiment, a gap-fill insulating layer 180 may be then formed to fill the opening 105 as illustrated in FIG. 2.

The protective layer PL may be formed of a material having an etch selectivity to the sacrificial layer 130. A thickness of the protective layer PL and a kind of the material of the protective layer PL may vary according to a material and a thin layer structure of the plugging layer TL. Since the protective layer PL and the mold layer 120 are formed by different manufacturing processes, the protective layer PL may be different from the mold layer 120 in at least one of chemical composition, density, and concentration of contained impurities, or a discontinuous interface may be formed between the protective layer PL and the mold layer 120.

Figure 3:
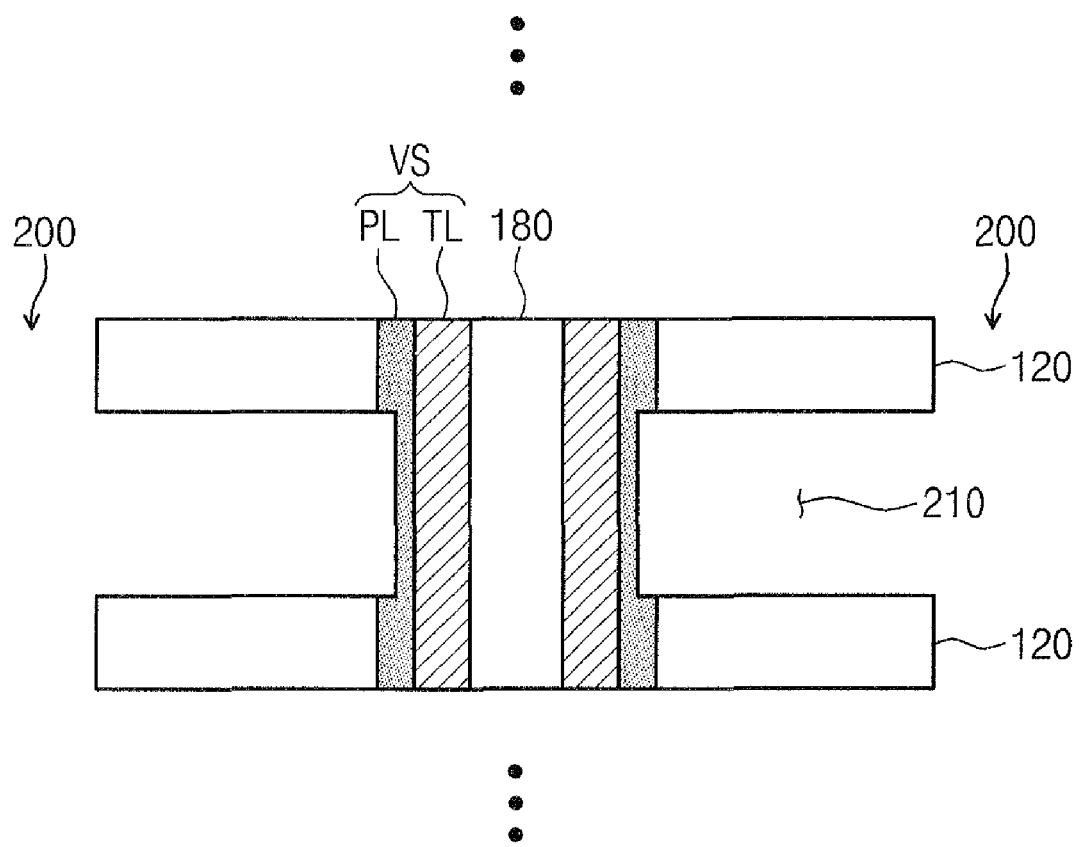

Referring to FIG. 3, the mold layers 120 and the sacrificial layers 130 are patterned to form trenches 200 (or second openings) exposing sidewalls of the sacrificial layers 130. The trenches 200 may be formed to penetrate the mold layers 120 and the sacrificial layers 130 at places spaced apart from the opening 105.

Subsequently, the sacrificial layers 130 exposed by the trenches 200 are selectively removed to form recess regions 210 each exposing a sidewall of the protective layer PL. Forming the recess region 210 includes isotropically etching the sacrificial layers 130 using an etch recipe having an etch selectivity to the mold layers 120 and the protective layer PL. For example, according to an embodiment, in the case that the mold layer 120 and the sacrificial layer 130 are a silicon oxide layer and a silicon nitride layer, respectively, the recess region 210 may be formed using an etching solution including a phosphoric acid. In the case that the mold layer 120 and the protective layer PL do not have a sufficiently great etch selectivity to the sacrificial layer 130, a portion of the protective layer PL adjacent to the sacrificial layer 130 may be recessed during an etch of the sacrificial layer 130 as illustrated in FIG. 3.

Figure 4:
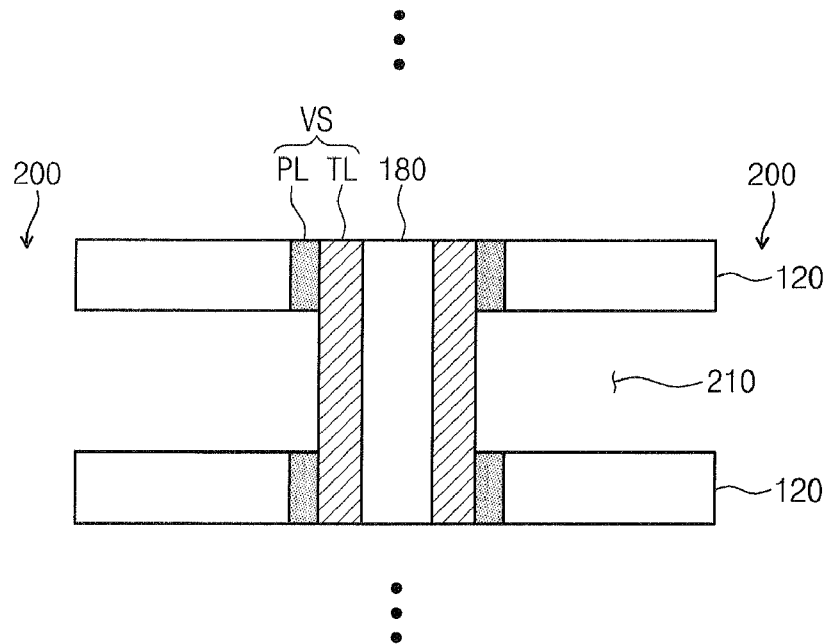
Figure 5:
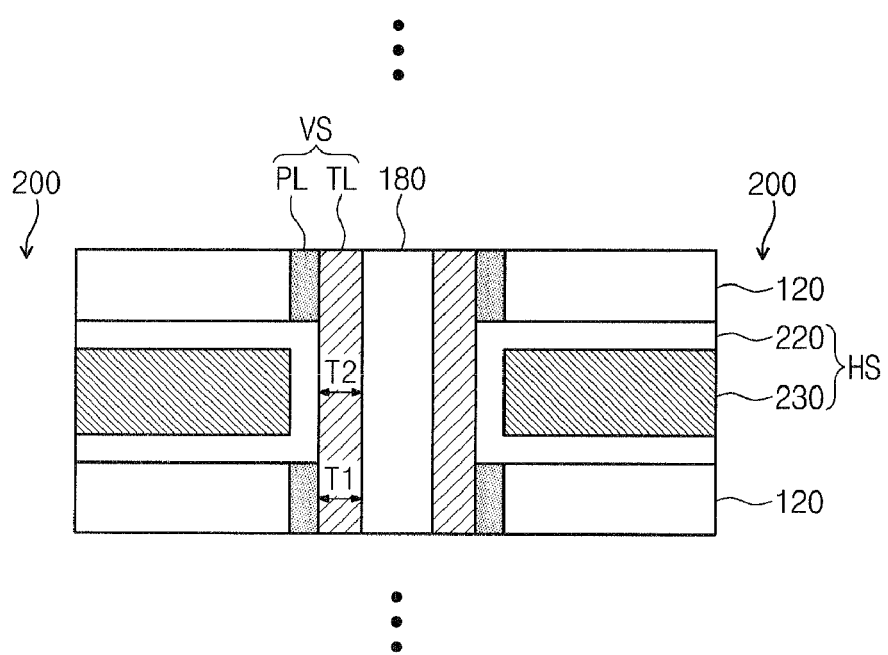

Thereafter, as illustrated in FIG. 4, an exposed portion of the protective layer PL is selectively removed to expose a surface of the plugging layer TL adjacent to the protective layer PL, and then, as illustrated in FIG. 5, horizontal structures HS are each formed to cover an exposed surface of the plugging layer TL. The horizontal structure HS includes a conductive pattern 230 and an intermediate pattern 220 (or a horizontal pattern) disposed between sidewalls of the conductive pattern 230 and the plugging layer TL. The intermediate pattern 220 horizontally extends to cover top and bottom surfaces of the conductive pattern 230 as illustrated in FIG. 5.

Exposing a surface of the plugging layer TL is performed using an etch recipe having an etch selectivity to the plugging layer TL. According to an embodiment, the etch recipe may be selected to have an etch selectivity to the mold layer 120. According to an embodiment, the mold layer 120 and the protective layer PL may be formed of a material that does not have a sufficiently high etch selectivity. According to an embodiment, during a removal of an exposed portion of the protective layer PL, a thickness (for example, a distance between two mold layers vertically adjacent to each other) of the recess region 210 may be greater than a deposition thickness of the sacrificial layer 130.

According to an embodiment, the protective layer PL and the mold layer 120 may be etched together while exposing a surface of the plugging layer TL, but etch speeds of the protective layer PL and the mold layer 120 may be different from each other. For example, in the case that an etch speed of the protective layer PL is greater than an etch speed of the mold layer 120, an average vertical thickness of the protective layer PL may be smaller than an average vertical thickness of the mold layer 120, and as a consequence, a portion of the horizontal structure HS extends between sidewalls of the mold layer 120 and the plugging layer TL and a vertical thickness of an area of the horizontal structure HS which is adjacent to the protective layer PL may be greater than a vertical thickness of an area of the horizontal structure HS which is adjacent to the mold layer 120 as illustrated in FIG. 6. In the case that an etch speed of the protective layer PL is smaller than an etch speed of the mold layer 120, a vertical thickness of the protective layer PL may be greater than a vertical thickness of the mold layer 120, and as a consequence, a vertical thickness of an area of the horizontal structure HS which is adjacent to the protective layer PL may be smaller than a vertical thickness of an area of the horizontal structure HS which is adjacent to the mold layer 120 as illustrated in FIG. 7.

According to an embodiment of the inventive concept, the step of forming the protective layer PL before forming the plugging layer TL may be omitted. According to an embodiment, the plugging layer TL is formed to directly contact the mold layer 120 as illustrated in FIG. 8. However, in the case that the plugging layer TL is formed of a material that does not have an etch selectivity to the sacrificial layer 130, a surface of the plugging layer TL may be recessed during a formation of the recess region 210. Product quality may be affected by a uniformity of thickness of the plugging layer TL, and the recess may be prevented.

As described with reference to FIGS. 1 through 7, the protective layer PL is disposed between the sacrificial layer 130 and the plugging layer TL to protect a surface of the plugging layer TL during a formation of the recess region 210, and as a consequence, a uniformity of thickness of the plugging layer TL can be obtained. For example, according to an embodiment of the inventive concept, a difference (T1−T2) between a thickness T1 of the plugging layer TL measured on a sidewall of the protective layer PL and a thickness T2 of the plugging layer TL measured on a sidewall of the intermediate pattern 220 may be smaller than one-tenth of an average thickness of the plugging layer PL.

FIGS. 9 through 19 are perspective views illustrating a method of fabricating a three dimensional semiconductor device according to an embodiment of the inventive concept.

Figure 9:
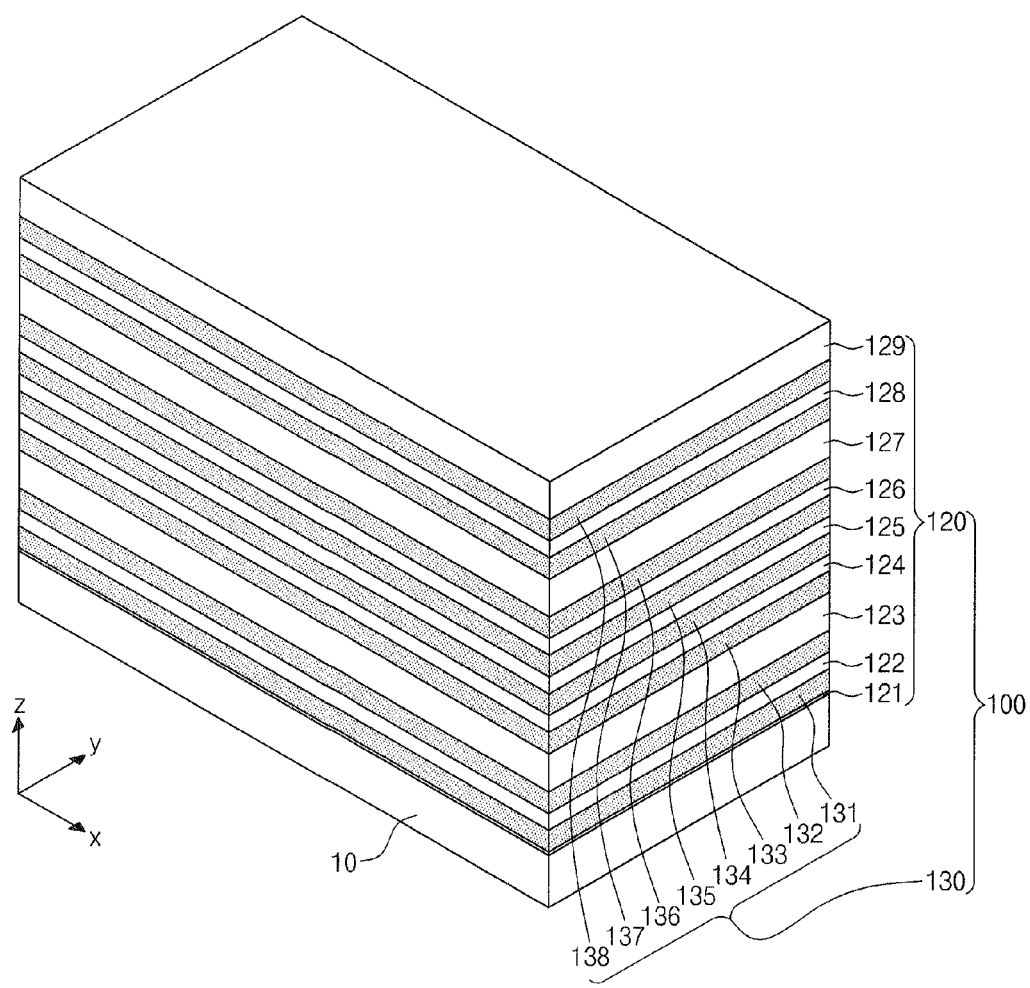
FIGS. 9 through 19 are perspective views illustrating a method of fabricating a three dimensional semiconductor device according to an embodiment of the inventive concept.

Referring to FIG. 9, a mold structure 100 is formed on a substrate 10. According to embodiments, the substrate 10 may be, for example, a material having a semiconductor characteristic, an insulating material, a semiconductor, a conductor, and/or, one or more of these materials covered with an insulating material. For example, according to an embodiment, the substrate 10 may be a silicon wafer.

According to an embodiment, a lower structure (not illustrated) including at least a transistor may be disposed between the substrate 10 and the mold structure 100. Hereinafter, for convenience of description, exemplary embodiments will be described where a mold structure 100 is directly formed on a substrate 10. However, the exemplary embodiments of the inventive concept are not limited thereto.

The mold structure 100 includes a plurality of insulating layers 120 (121~129), which have been also referred to as "mold layers" in connection with FIGS. 1 to 8, and a plurality of sacrificial layers 130 (131~138). The insulating layers 120 and the sacrificial layers 130 are, as illustrated in FIG. 9, alternately and repeatedly stacked. The sacrificial layers 130 are formed of a material having an etch selectivity to the insulating layers 120. For example, according to an embodiment, the sacrificial layer 130 may be formed of a material that can minimize an etch of the insulating layer 120 while etching the sacrificial layers 130 using a predetermined etch recipe. The etch selectivity may be quantitatively represented by a rate of an etch speed of the sacrificial layer 130 to an etch speed of the insulating layer 120. According to an embodiment, the sacrificial layer 130 may be a material that may provide an etch selectivity of 1:10~1:200 (more specifically, 1:30~1:100) with respect to the insulating layer 120. For example, according to an embodiment, the insulating layer 120 may be at least one of a silicon oxide layer and a silicon nitride layer. According to an embodiment, the sacrificial layer 130 may be a material selected from a silicon layer, a silicon oxide layer, silicon carbide, and a silicon nitride layer and may be a different material from the insulating layer 120. For convenience of description, an embodiment will be described where the insulating layers 120 each are a silicon oxide layer, and the sacrificial layers 130 each are a silicon nitride layer.

According to an embodiment, as illustrated in the drawing, the sacrificial layers 130 may be formed with substantially the same thickness. Alternatively, thicknesses of the insulating layers 120 may be different from one another. For example, according to an embodiment, the lowermost layer 121 of the insulating layers 120 may be formed to be thinner than the sacrificial layer 130, the third insulating layer 123 from the bottom and the third insulating layer 127 from the top may be formed to be thicker than the sacrificial layer 130, and the remaining insulating layers 120 may be formed to be thicker or thinner than the sacrificial layer 130. However, the embodiments of the present invention are not limited thereto. According to embodiments, the insulating layers 120 may have various thicknesses, and various numbers of the layers may constitute the mold structure 100.

Figure 10:
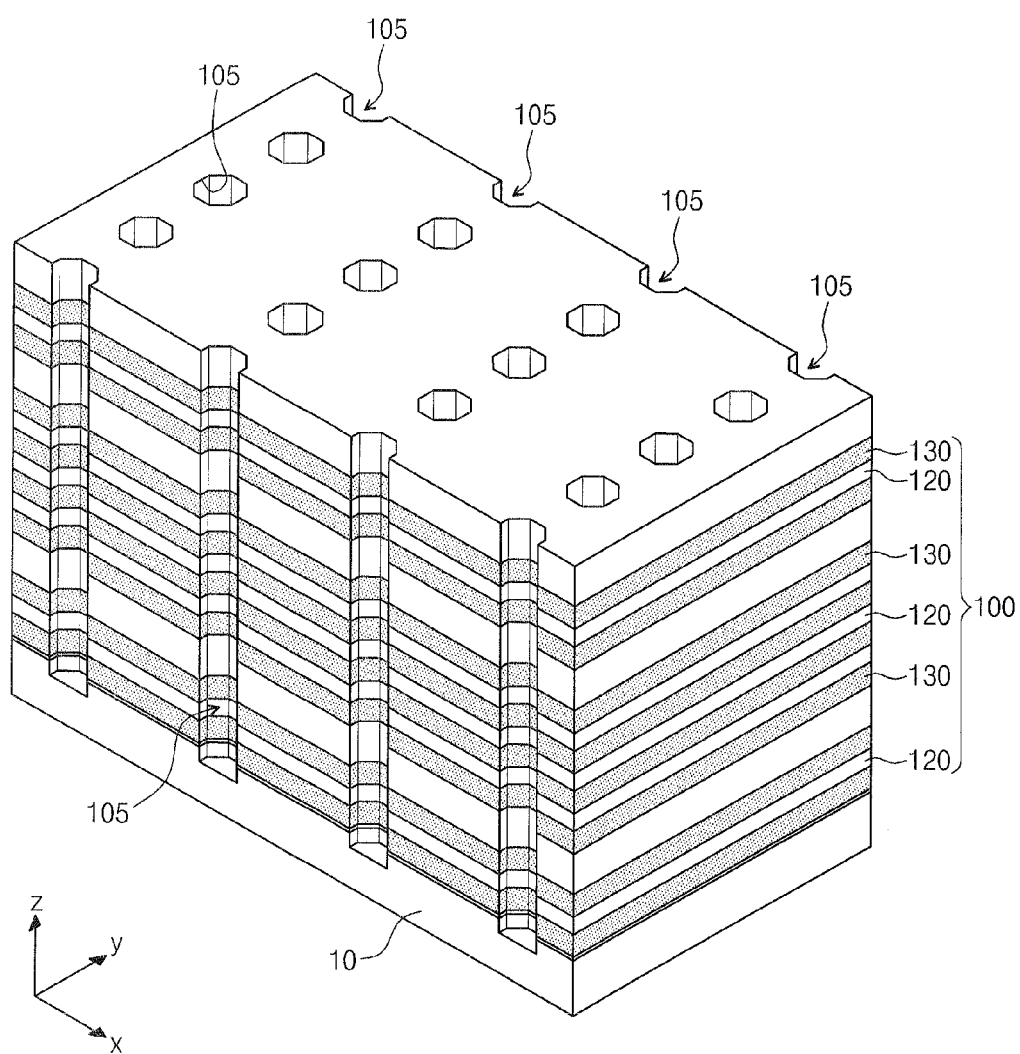
Figure 11:
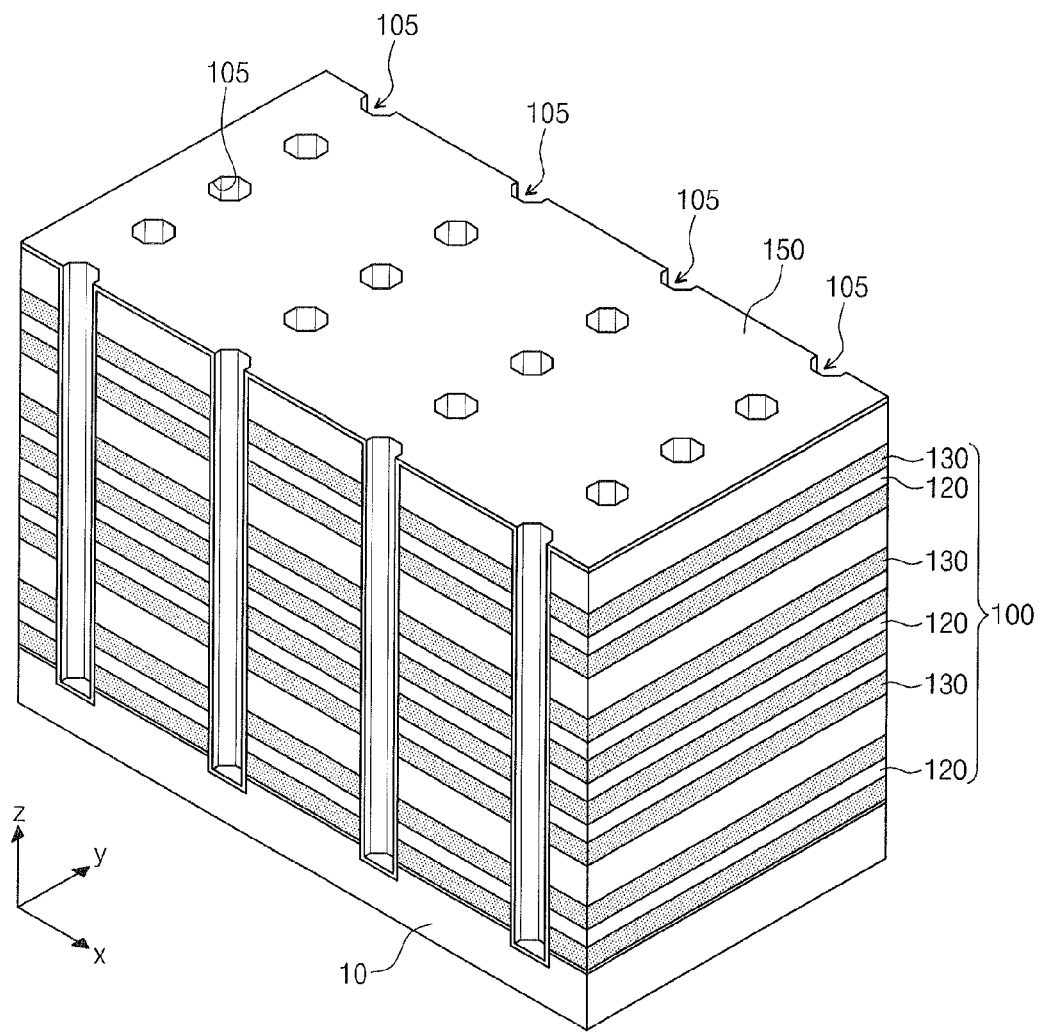

Referring to FIGS. 10 and 11, after forming openings 105 (first openings) penetrating the mold structure 100, a vertical layer (protective layer) 150 is formed to conformally cover inner walls of the openings 105. The vertical layer 150 may be formed of a material having an etch selectivity to the sacrificial layer 130. According to the embodiment, the vertical layer 150 horizontally extends from the openings 105 to cover a top surface of the mold structure 100.

According to an embodiment, each of the openings 105 may be formed to have a hole shape. According to an embodiment, each of the openings 105 may be formed such that a depth of the opening 105 is at least five times a width of the opening 105. According to an embodiment, the openings 105 may be two dimensionally formed on a top surface (for example, an xy plane) of the substrate 10. For example, according to an embodiment, each of the openings 105 may be isolated and spaced apart from the other openings 105 along x and y directions.

According to an embodiment, forming the openings 195 may include forming a predetermined mask pattern defining a location of the openings 105 on the mold structure 100 and anisotropically etching the mold structure 100 using the mask pattern as an etching mask. Since the mold structure 100 may include at least two different kinds of layers, a sidewall of the opening 105 may not be perfectly perpendicular to a top surface of the substrate 10. For example, as it approaches a top surface of the substrate 10, a width of the opening 105 may decrease—that is, a non-uniformity of widths of the openings 105 occurs. Such a non-uniformity of widths of the openings 105 may cause a non-uniformity of operation characteristics of transistors three-dimensionally arranged. A detailed description of the non-uniformity and methods capable of decreasing the non-uniformity are disclosed in U.S. patent application Ser. No. 12/420,518, the entire contents of which are incorporated by reference herein.

In the case that the mold structure 100 is directly formed on the substrate 10, the opening 105 may be formed to expose a top surface of the substrate 10 as shown in FIG. 11. As a result of an over etch in the anisotropic etching step, the substrate 10 may be recessed by a predetermined depth under the opening 105 as shown in FIG. 11.

Figure 12:
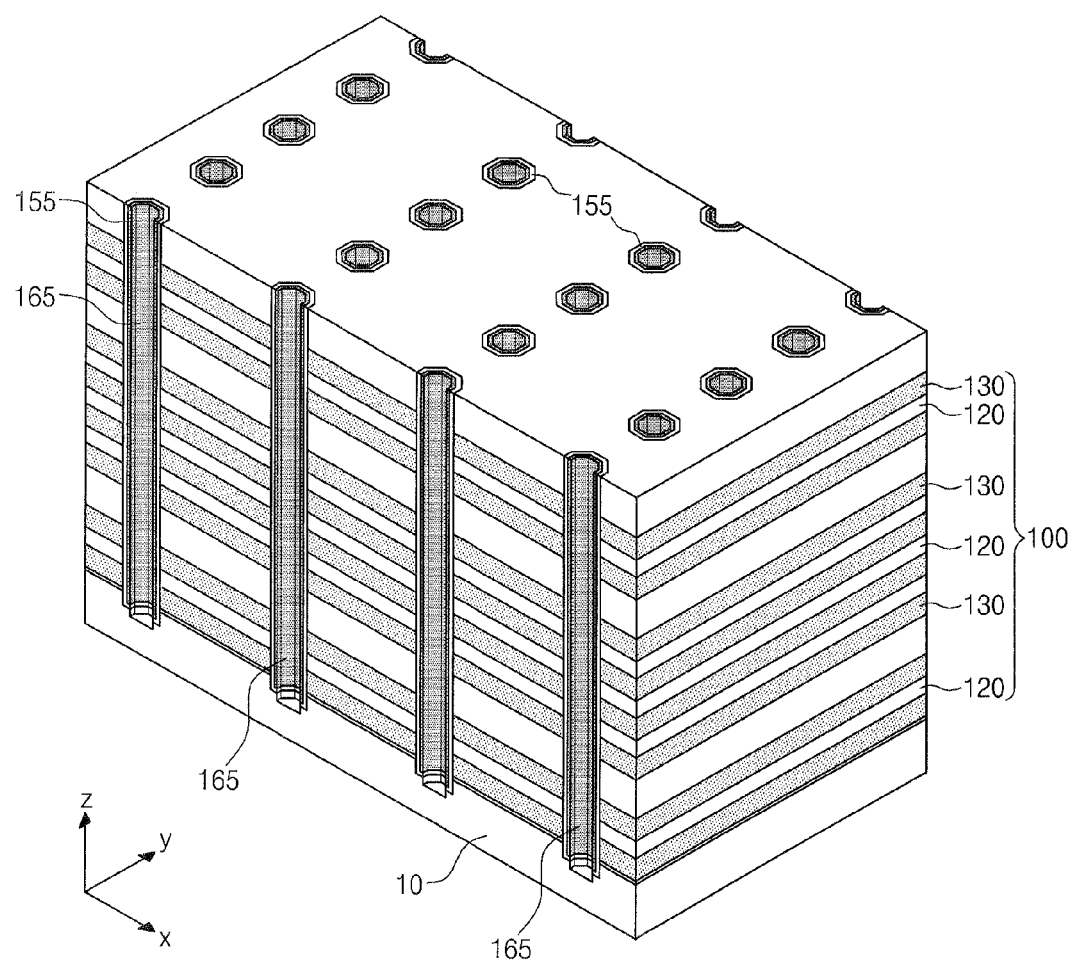

Referring to FIG. 12, a vertical pattern 155 and a semiconductor spacer 165 are formed to sequentially cover an inner wall of each of the openings 105. This step may include a step of forming a first semiconductor layer conformally covering a resultant structure in which the vertical layer 150 is formed and then exposing a top surface of the substrate 10 at bottoms of the openings 105 by anisotropically etching the first semiconductor layer and the vertical layer 150. As a result, the vertical pattern 155 and the semiconductor spacer 165 may be formed to have a cylindrical shape having two open ends. Also, as a result of an over etch in the step of anisotropically etching the first semiconductor layer, a top surface of the substrate 10 exposed by the semiconductor spacer 165 may be recessed as shown in FIG. 12.

Figure 32:
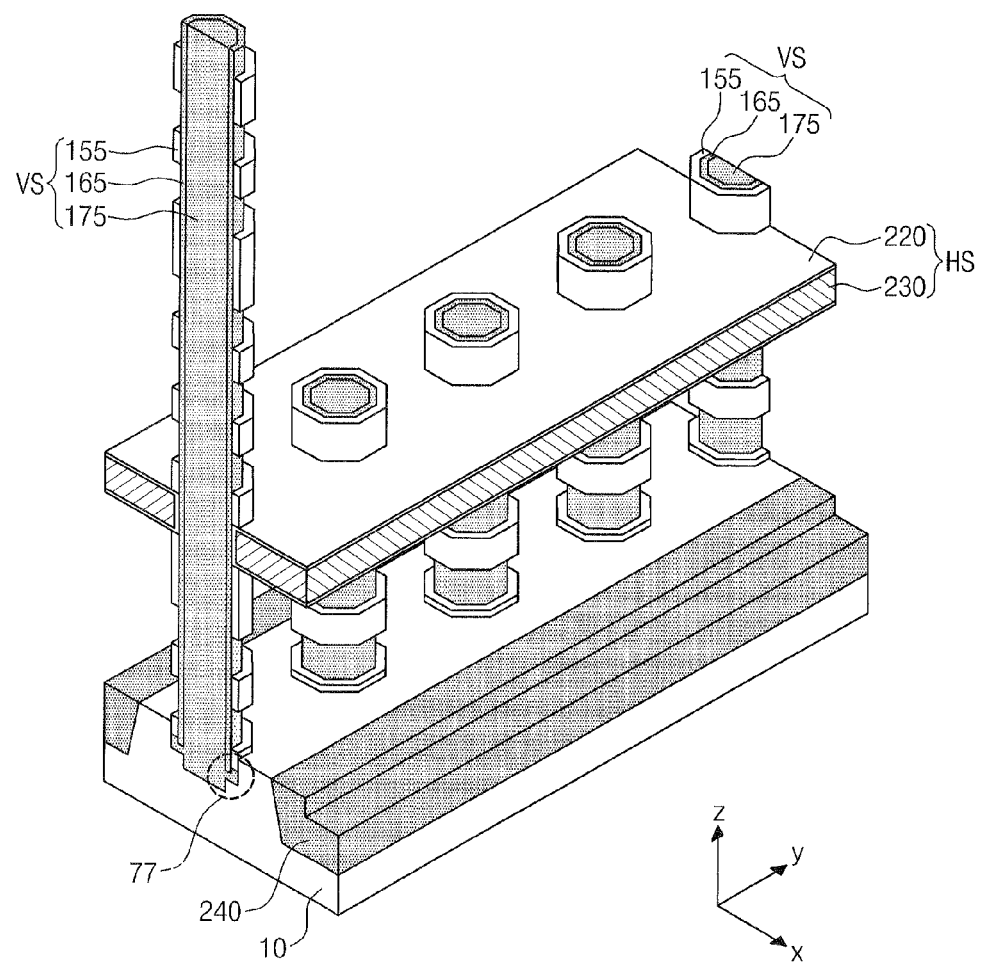

During the anisotropic etching, a portion of the vertical layer 150 located under the semiconductor spacer 165 may not be etched and as a result, the vertical pattern 155 may have a bottom portion interposed between a bottom surface of the semiconductor spacer 165 and a top surface of the substrate 10. According to an embodiment, etching an exposed surface of the vertical pattern 155 using the semiconductor spacer 165 as an etching mask may further be performed. According to an embodiment, as illustrated in FIG. 32, an undercut region may be formed under the semiconductor spacer 165 and a length of the vertical pattern 155 may become smaller than a length of the semiconductor spacer 165.

As a result of an anisotropic etch of the first semiconductor layer and the vertical layer 150, a top surface of the mold structure 100 may be exposed. Accordingly, each of the vertical patterns 155 and each of the semiconductor spacers 165 may remain in the openings 105. For example, the vertical patterns 155 and the semiconductor spacers 165 may be two dimensionally arranged on an xy plane.

According to an embodiment, the first semiconductor layer may be a polycrystalline silicon layer formed using one of an atomic layer deposition (ALD) technology or a chemical vapor deposition (CVD) technology. According to an embodiment, the first semiconductor layer may be formed to have a thickness selected in a range of 1/50~1/5 of a width of the opening 105. According to an embodiment, the first semiconductor layer may be formed using an epitaxial technology. For example, according to an embodiment, one of epitaxial technologies disclosed in a U.S. patent application Ser. No. 13/018,833 filed on Feb. 1, 2011, the entire contents of which are incorporated by reference herein may be used. According to an embodiment, the first semiconductor layer may be one of an organic semiconductor layer and carbon nano structures.

Figure 13:
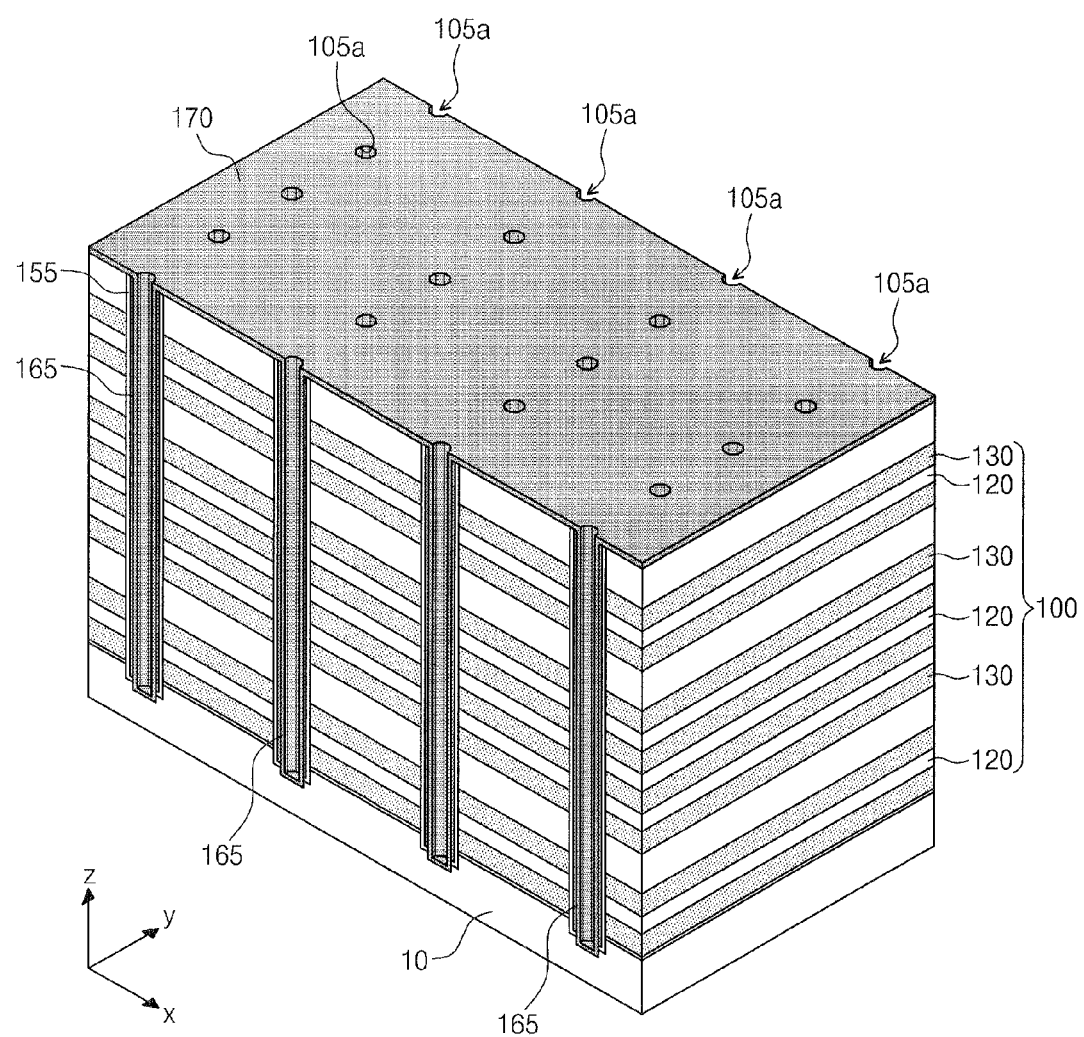
Figure 14:
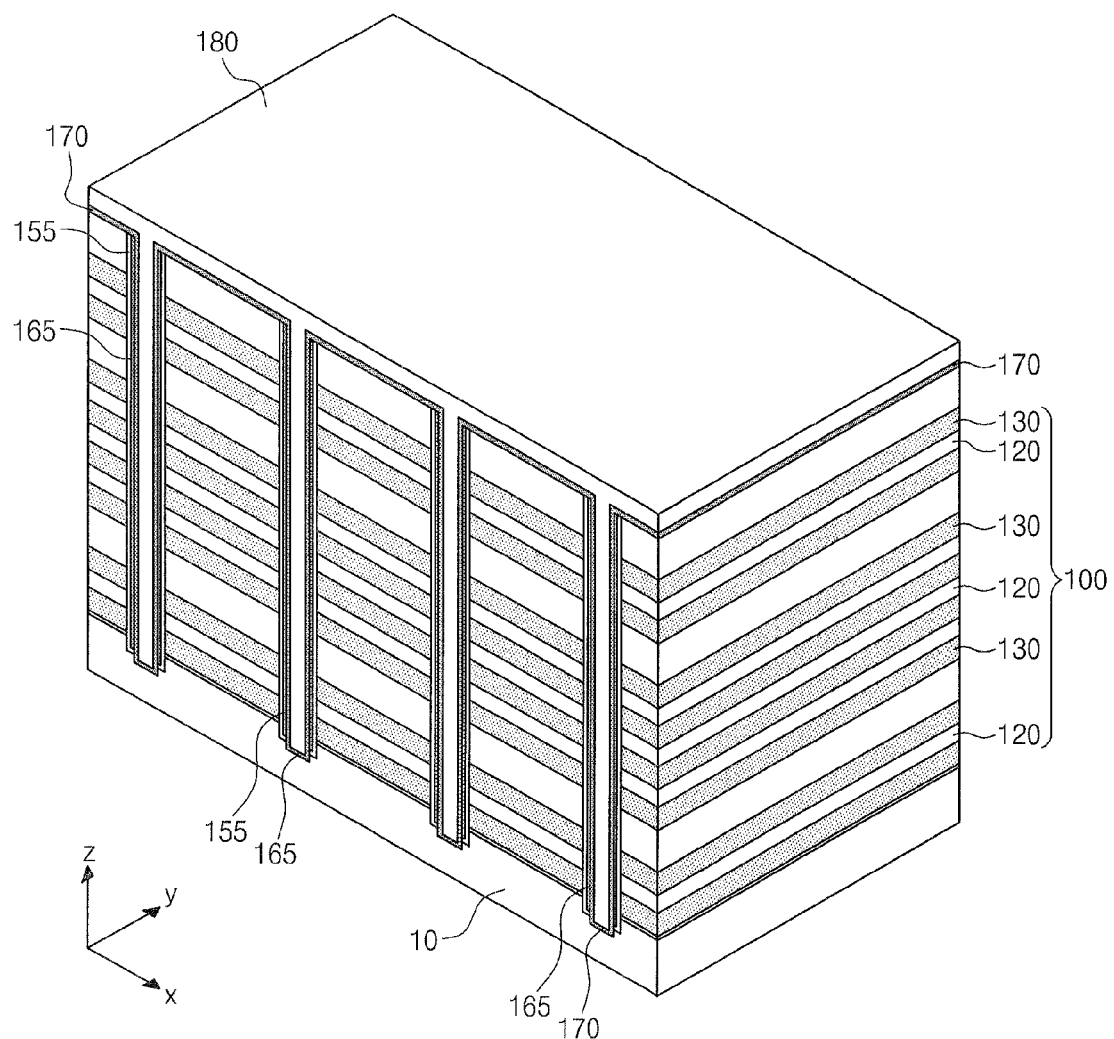

Referring to FIGS. 13 and 14, a second semiconductor layer 170 and a gap-fill insulating layer 180 are sequentially formed on a resultant structure in which the vertical pattern 155 is formed. The second semiconductor layer 170, the semiconductor spacer 165, and the second semiconductor layer 170 constitute the plugging layer TL described in connection with FIGS. 1 to 5.

According to an embodiment, the second semiconductor layer 170 may be a polycrystalline silicon layer formed using one of an atomic layer deposition (ALD) technology or a chemical vapor deposition (CVD) technology. According to an embodiment, the second semiconductor layer 170 may be conformally formed not to completely fill the openings 105. For example, according to an embodiment, the second semiconductor layer 170 may define pinholes 105a inside the openings 105 as shown in FIG. 13.

The gap-fill insulating layer 180 is formed to fill the pinholes 105a. According to an embodiment, the gap-fill insulating layer 180 may be an insulating material formed using a spin on glass (SOG) technology and a silicon oxide layer. According to an embodiment, before forming the gap-fill insulating layer 180, a hydrogen annealing step of annealing a resultant structure including the second semiconductor layer 170 under gas atmosphere including hydrogen or heavy hydrogen may further be performed. Many of crystal defects existing in the semiconductor spacer 165 and the second semiconductor layer 170 can be cured by the hydrogen annealing step.

According to an embodiment of the inventive concept, the second semiconductor layer 170 may be formed to fill the semiconductor spacer 165. According to an embodiment, the step of forming the gap-fill insulating layer 180 may be omitted, which is exemplified in FIGS. 31 and 32.

Figure 15:
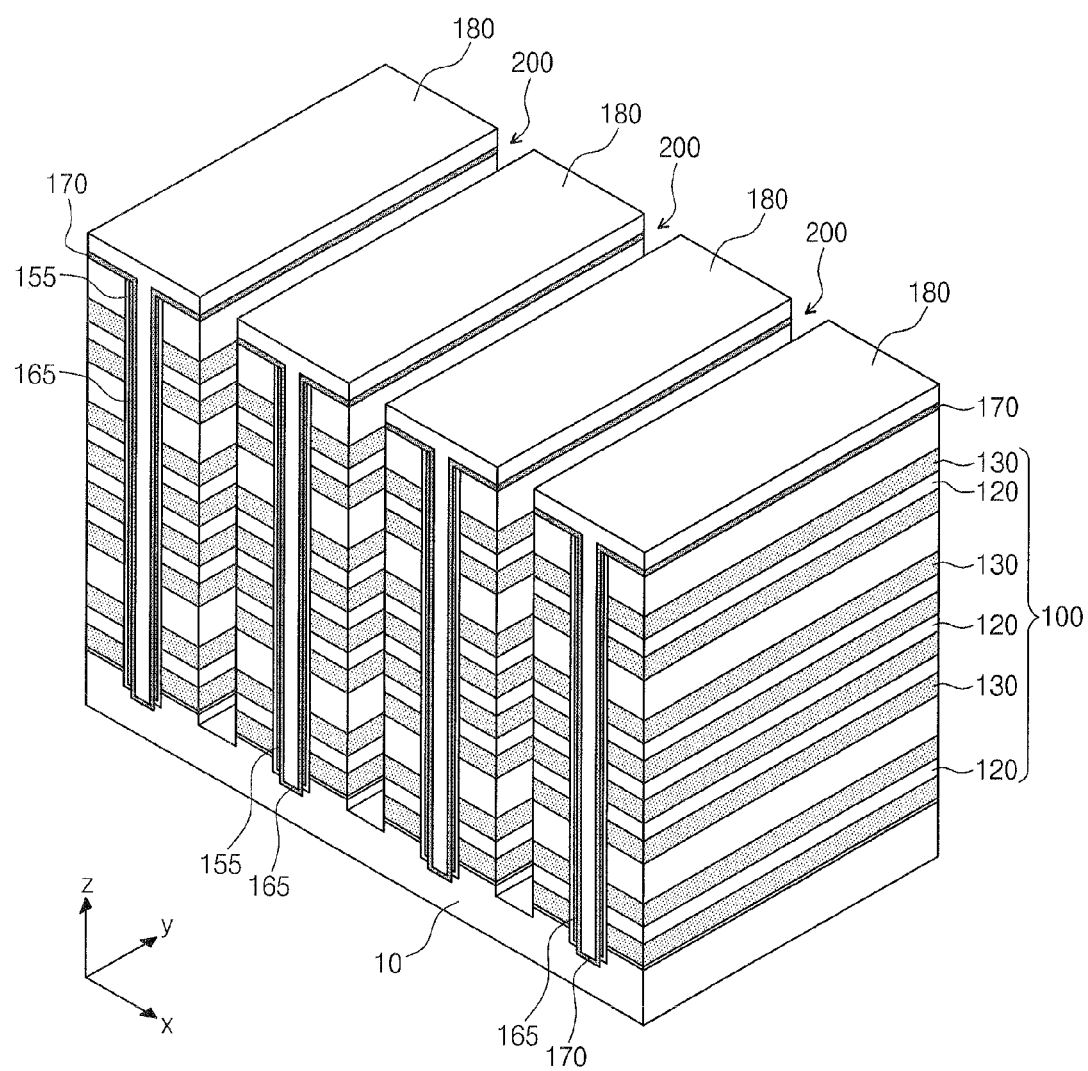

Referring to FIG. 15, trenches 200 are formed to expose sidewalls of the sacrificial layers 130 and the insulating layers 120 while penetrating the mold structure 100. As shown in FIG. 15, the trenches 200 are formed to be spaced apart from the openings 105 and to cross the area between the openings 105.

Forming the trenches 200 includes a step of forming an etching mask on an upper portion of the mold structure 100 or on an upper portion of the gap-fill insulating layer 180 followed by anisotropically etching layers under the etching mask down to a top surface of the substrate 10. Accordingly, as illustrated in FIG. 15, the second semiconductor layer 170 and the gap-fill insulating layer 180 are patterned on an upper portion of the mold structure 100 to define upper entrances of the trenches 200. As a result of an over-etch in the anisotropic etching step, the substrate 10 under the trenches 200 may be recessed by a predetermined depth as illustrated in FIG. 15.

Since an etch target is substantially the same, as it approaches a top surface of the substrate 10, a width of the trenches 200 decreases similar to the case of the openings 105—for example, a non-uniformity of widths of the trenches 200 occurs. Such a non-uniformity of widths of the trenches 200 may cause a non-uniformity of operation characteristics of transistors three dimensionally arranged. A detailed description of the non-uniformity and methods capable of decreasing the non-uniformity are disclosed in U.S. patent application Ser. No. 12/420,518 filed on Apr. 8, 2009, the entire contents of which are incorporated by reference herein.

According to an embodiment, as illustrated in FIG. 15, a pair of trenches 200 may be formed at both sides of the openings 105. For example, according to an embodiment, the number of the openings 105 arranged along an x axis direction at the same y coordinate may be substantially the same as the number of trenches 200. However, the embodiments of the inventive concept are not limited thereto. For example, according to an embodiment, the openings 105 and the trenches 200 may be arranged with respect to each other as disclosed in U.S. patent application Ser. No. 12/953,748 filed on Nov. 24, 2010, the entire contents of which are incorporated by reference herein.

Figure 16:
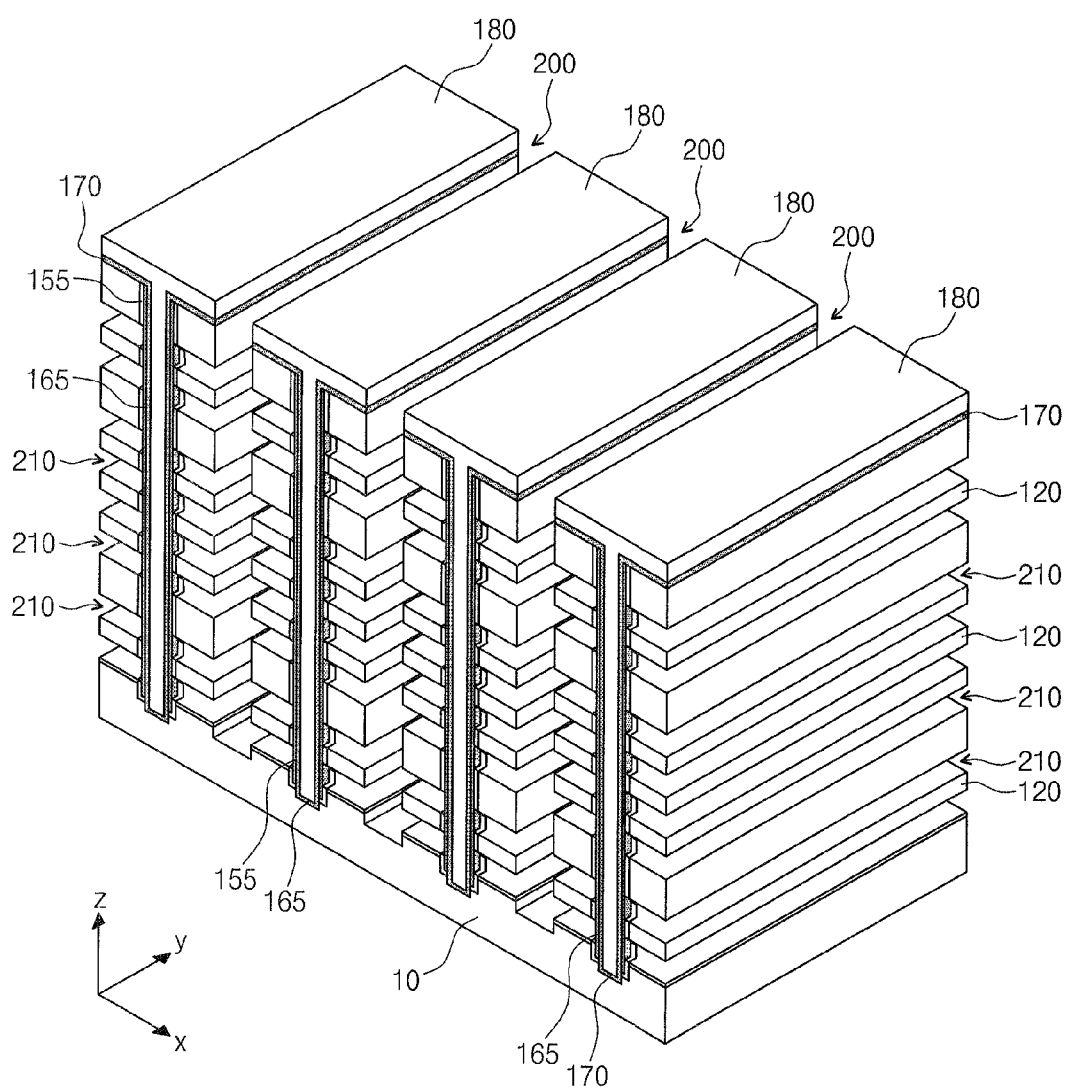

Referring to FIG. 16, recess regions 210 are formed to expose sidewalls of the vertical patterns 155 between the insulating layers 120 by selectively removing the exposed sacrificial layers 130. Subsequently, exposed surfaces of the vertical patterns 155 are etched to expose sidewalls of the semiconductor spacers 165.

The recess regions 210 each is a gap region formed to horizontally extend from the trenches 200 and are formed to expose sidewalls of the vertical patterns 155. More specifically, an outer boundary of the recess region 210 is limited by the insulating layers 120 disposed at upper/lower portions of the recess region 210 and by the trenches 200 disposed at both sides of the recess region 210. Also, an internal boundary of the recess region 210 is defined by the vertical patterns 155 vertically penetrating the recess region 210.

Forming the recess regions 210 includes horizontally etching the sacrificial layers 130 using an etch recipe having an etch selectivity to the insulating layers 120 and the vertical patterns 155. For example, in the case that the sacrificial layers 130 are silicon nitride layers and the insulating layers 120 are silicon oxide layers, the horizontal etch step may be performed using an etchant including phosphoric acid. According to an embodiment, as described with reference to FIG. 3, the vertical patterns 155 each may function as a protective layer or an etching stop layer that prevents the semiconductor spacer 165 from being recessed when forming the recess region 210.

Exposing a sidewall of the semiconductor spacer 165 may be performed using an etch recipe having an etch selectivity to the insulating layers 120 and the semiconductor spacer 165. For example, exposing the sidewall of the semiconductor spacer 165 may, as described with reference to FIG. 4, be performed by a wet etching process using an etchant including hydrofluoric acid. As a result, the vertical patterns 155 are vertically separated and each of the separated vertical patterns 155 may have a ring shape locally disposed between the insulating layer 120 and the sidewall of the semiconductor spacer 165.

Figure 17:
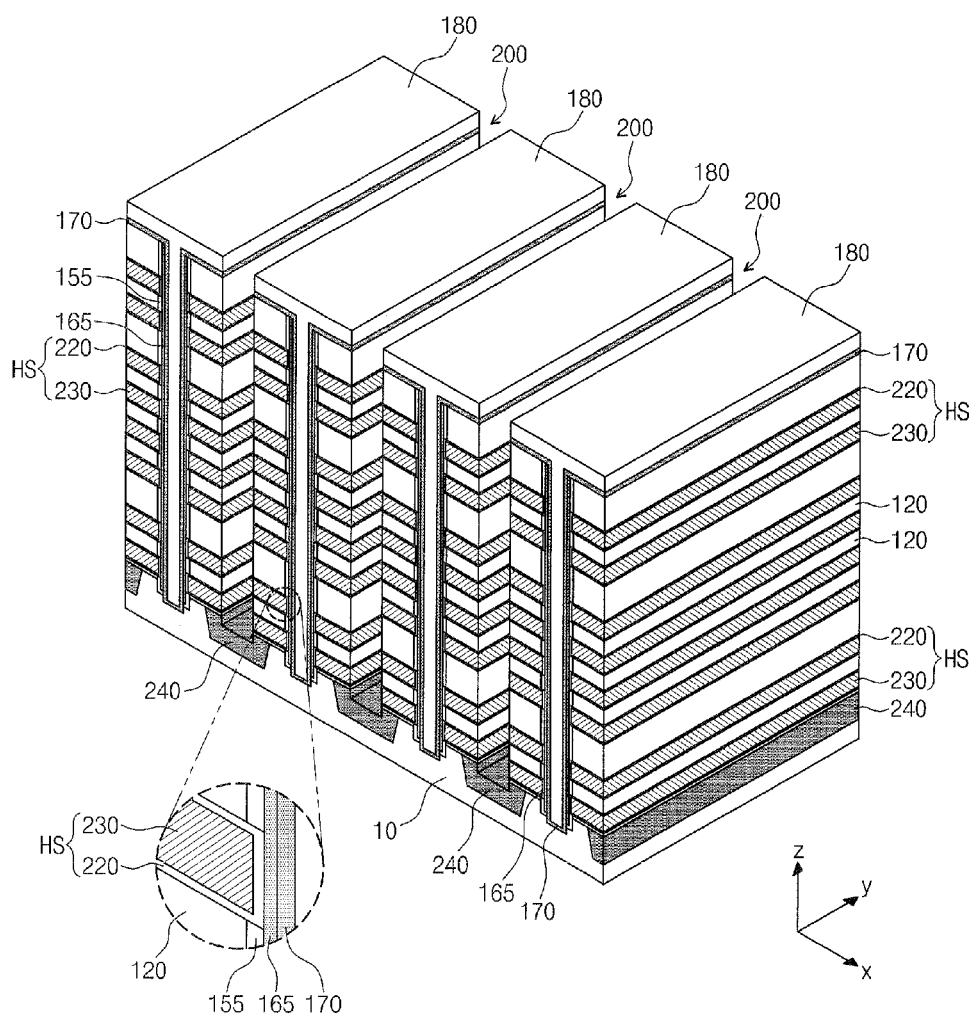

Referring to FIG. 17, horizontal structures HS are formed to fill the recess regions 210. The horizontal structures HS each may include a horizontal patterns 220 (or intermediate pattern) covering an inner wall of the recess region 210 and a conductive pattern 230 filling the remaining space of the recess region 210.

Forming the horizontal structures HS may include forming horizontal layers and conductive layers sequentially filling the recess regions 210 and then removing the conductive layers from the trenches 200 to leave the conductive patterns 230 in the recess regions 210.

According to an embodiment, the horizontal layer or the horizontal pattern 220 may include a single thin layer or a plurality of thin layers similarly to the vertical layer 150. The conductive layer is formed to fill the recess regions 210 covered with the horizontal layer. According to an embodiment, the trenches 200 may be completely or partly filled with the conductive layer. According to an embodiment, the conductive layer may include at least one of doped silicon, metal materials, metal nitride layers, and metal silicide. For example, according to an embodiment, the conductive layer may include a tantalum nitride layer or tungsten. According to an embodiment, the conductive layer may be formed to conformally cover an inner wall of the trench 200. According to an embodiment, forming the conductive pattern 230 may include removing the conductive layer using an isotropic etching method. According to an embodiment, the conductive layer may be formed to fill the trench 200. According to an embodiment, forming the conductive pattern 230 may include anisotropically etching the conductive layer in the trench 200.

According to an embodiment for a flash memory, after forming the conductive patterns 230, forming impurity regions 240 may be further performed. According to an embodiment, the impurity regions 240 may be formed through an ion implantation process and may be formed in the substrate 10 exposed by the trench 200. The impurity region 240 has a different conductivity type from the substrate 10. A region (hereinafter referred to as a contact region) of the substrate 10 which is in contact with the second semiconductor layer 170 has the same conductivity type as the substrate 10. Thus, the substrate 10 or the second semiconductor layer 170 and each of the impurity regions 240 constitute a PN junction.

According to an embodiment, the impurity regions 240 may be connected to each other to have an equipotential state. According to an embodiment, the impurity regions 240 may be electrically separated from each other to have different potentials. According to an embodiment, the impurity regions 240 may respectively include a plurality of independent source groups each including a plurality of different impurity regions that may be electrically separated from each other to have different potentials.

Figure 18:
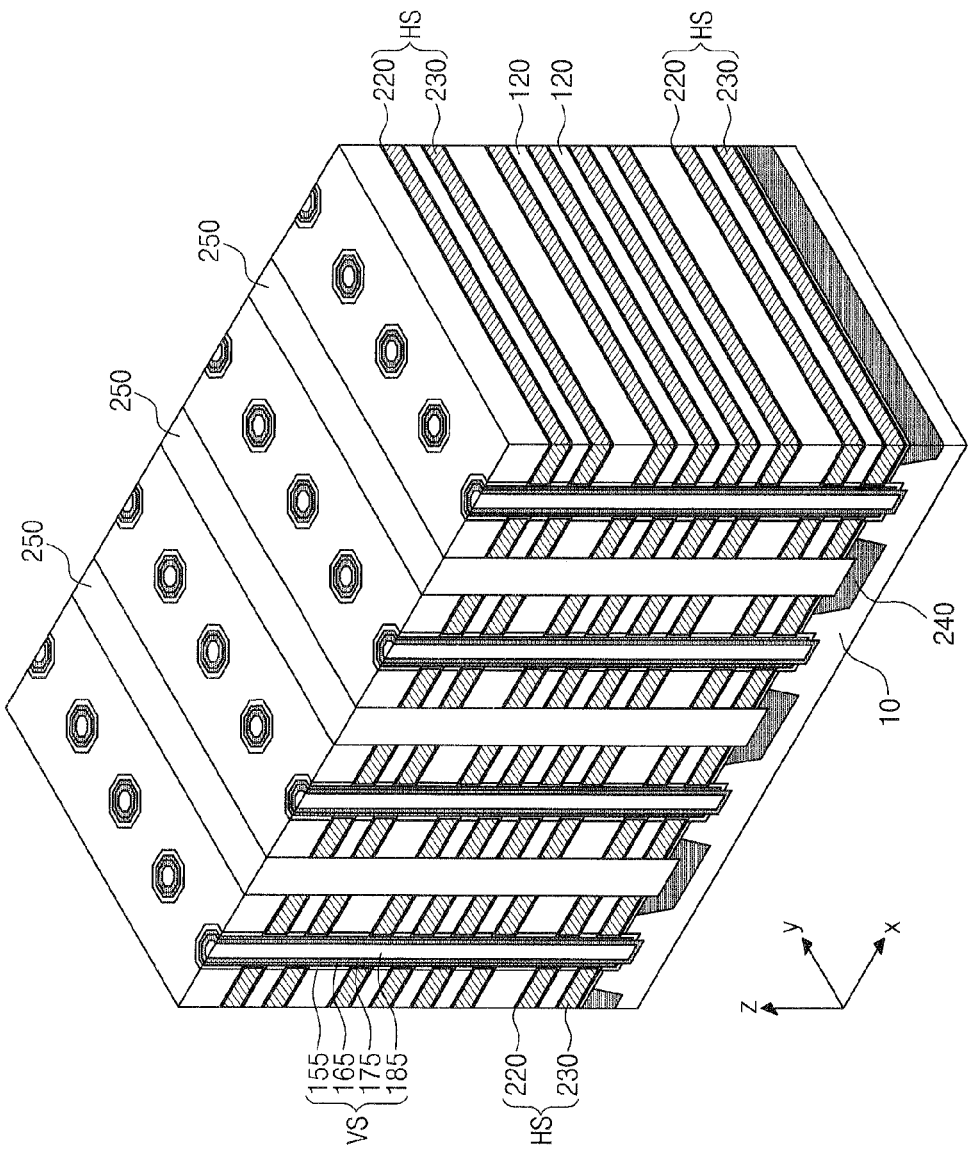

Referring to FIG. 18, electrode separation patterns 250 are formed to fill the trenches 200. Forming the electrode separation patterns 250 may include forming an electrode separation layer on a resultant structure including the impurity regions 240 and then etching the resultant structure to expose a top surface of the mold structure 100. According to an embodiment, the electrode separation layer may be formed of at least one of a silicon oxide layer, a silicon nitride layer, or a silicon oxynitride layer. According to an embodiment, the etching step may be performed using a planarization technology, such as a chemical-mechanical polishing technology or an etching back technology. As a result of the planarization etching, the gap-fill insulating layer 180 and the second semiconductor layer 170, as illustrated in FIG. 18, form gap-fill insulating patterns 185 and semiconductor body portions 175 locally disposed in inner walls of the openings 105, respectively.

According to an embodiment, the vertical pattern 155, the semiconductor spacer 165 and the semiconductor body portion 175 may form a vertical structure VS. A plurality of vertical structures VS are two dimensionally arranged while penetrating the mold structure 100. According to an embodiment, locations in which the vertical structures VS are disposed are defined by the openings 105. According to an embodiment, the gap-fill insulating pattern 185 may be also included in the vertical structure VS.

Figure 19:
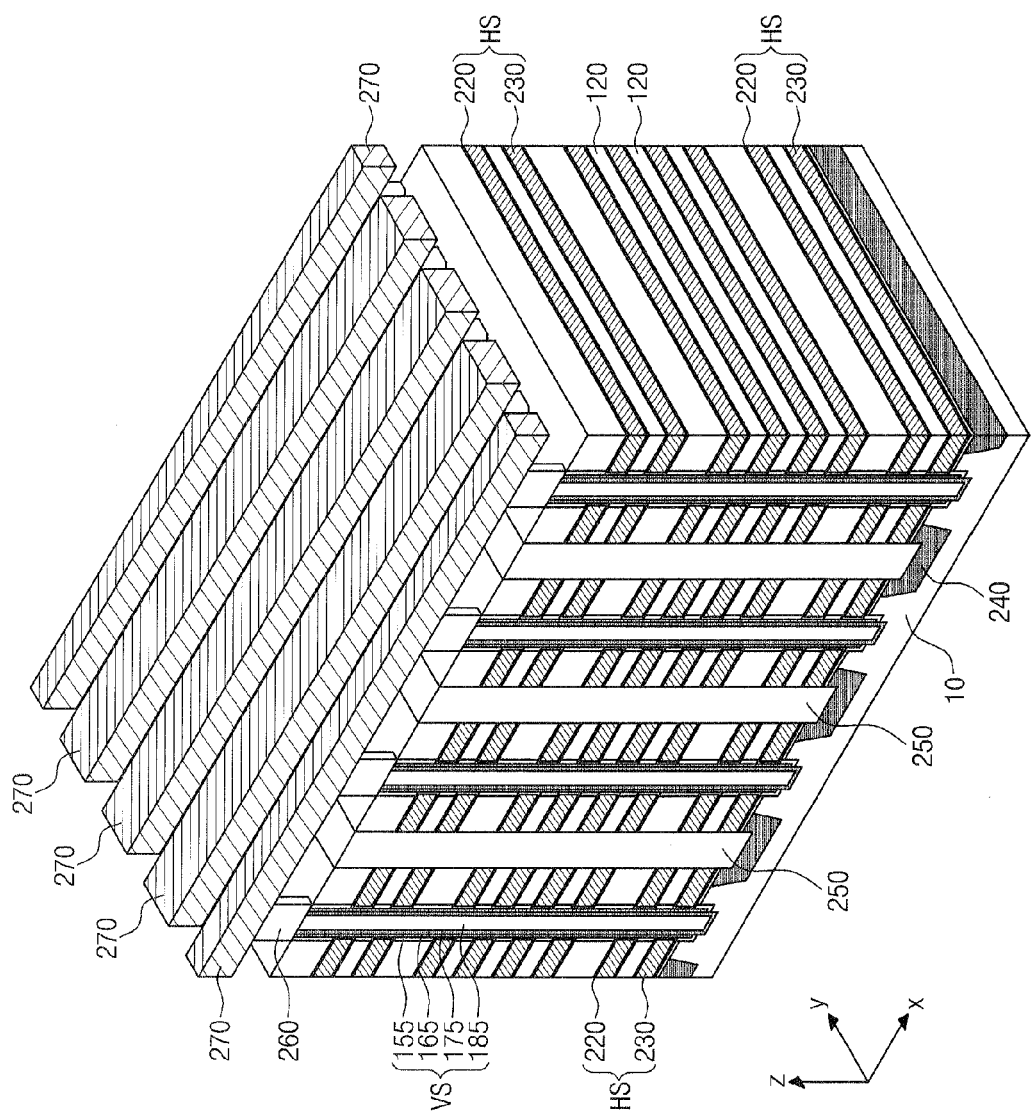

Referring to FIG. 19, upper plugs 260 are formed on the respective vertical structures VS, and upper interconnections 270 may be formed on the upper plugs 260 to connect the upper plugs 260 to one another.

According to an embodiment, upper regions of the semiconductor spacer 165 and the semiconductor body portion 175 may have an upper impurity region (not shown). According to an embodiment, a bottom of the upper impurity region may be located higher than a top surface of the uppermost layer of the horizontal structures HS. According to an embodiment, the upper impurity region may be doped with a different conductivity type from a portion of the semiconductor spacer 165 located under the upper impurity region, so that the upper impurity region and the portion may constitute a diode. According to an embodiment, the upper plugs 260 may include one of doped silicon or metal materials.

According to an embodiment, the plugs 260 each may be a silicon layer doped with a different conductivity type from the semiconductor spacer 165 and the semiconductor body portion 175. According to an embodiment, the upper plugs 260 each may constitute a PN junction with the semiconductor spacer 165 and the semiconductor body portion 175.

The upper interconnections 270 are electrically connected to the respectively corresponding semiconductor spacers 165 and the respectively corresponding semiconductor body portions 175 through the respectively corresponding upper plugs 260 and are formed to cross the horizontal structures HS. According to an embodiment for a NAND flash memory, the upper interconnections 270 may be used as bit lines each connected to one end of each of a plurality of cell strings.

Figure 20:
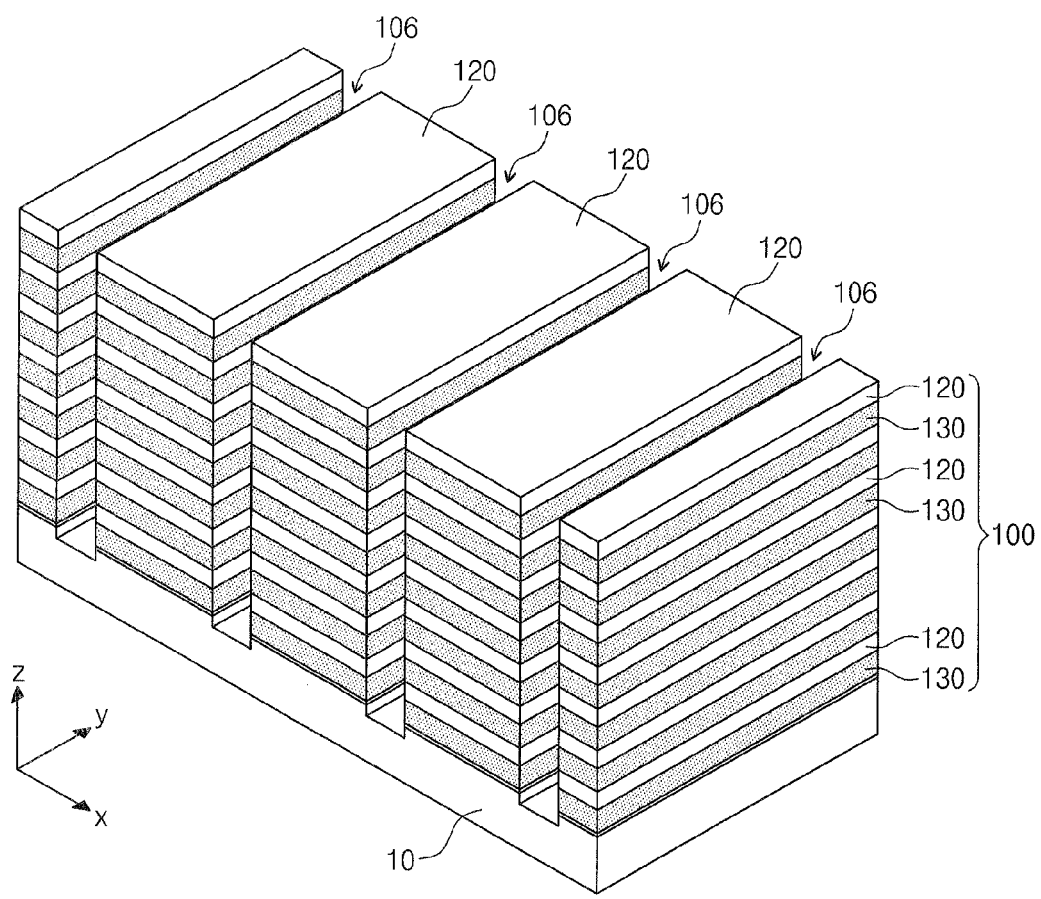
FIGS. 20 through 29 are perspective views illustrating a method of fabricating a three dimensional semiconductor device according to an embodiment of the inventive concept.

FIGS. 20 through 29 are perspective views illustrating a method of a three dimensional semiconductor device according to an embodiment of the inventive concept. Referring to FIGS. 9 and 20, openings 106 (or first openings) are formed to penetrate the mold structure 100. According to an embodiment, the openings 106 may include a hexahedral portion wherein a cross section on an xy plane and a cross section on an xz plane each has an aspect ratio of 5 or more. For example, according to an embodiment, lengths of the opening 106 in y and z directions may be greater than 5 times a length of the opening 106 in an x direction.

Figure 21:
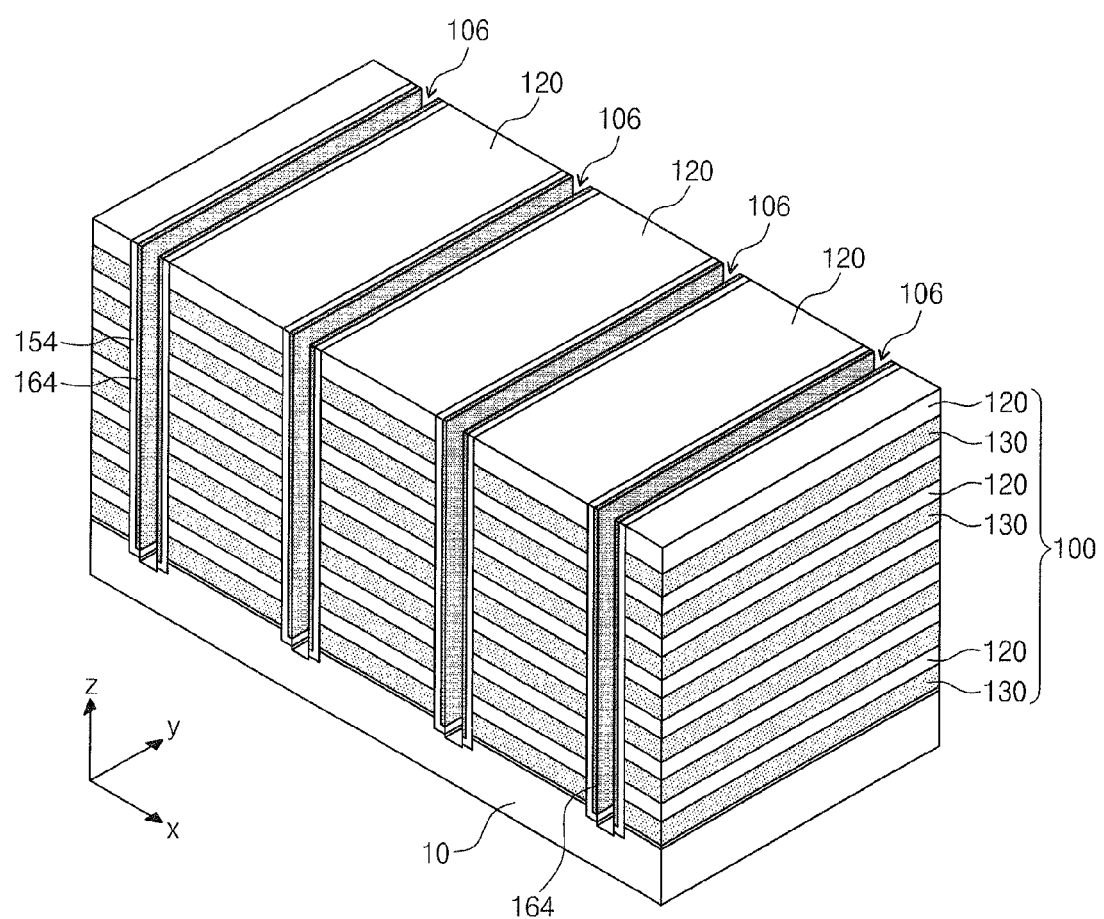

Referring to FIG. 21, a preliminary vertical pattern 154 and a preliminary semiconductor spacer 164 are formed to sequentially cover an inner wall of each of the openings 106. This step may include forming a vertical layer and a first semiconductor layer sequentially covering inner walls of the openings 106 and then anisotropically etching the first semiconductor layer to expose a top surface of the substrate 10 at bottoms of the openings 106. As a result of an over-etch when anisotropically etching the first semiconductor layer, as illustrated in FIG. 21, a top surface of the substrate 10 exposed by the preliminary semiconductor spacer 164 is recessed.

According to an embodiment, the preliminary vertical pattern 154 may include a single thin layer or a plurality of thin layers. According to an embodiment, in the case that the preliminary vertical pattern 154 includes a single thin layer, the preliminary vertical pattern 154 may constitute a protective layer PL as described in connection with FIGS. 1 to 5. According to an embodiment, in the case that the preliminary vertical pattern 154 includes a plurality of thin layers, at least a thin layer adjacent to the opening 106 may constitute a protective layer PL as described in connection with FIGS. 1 to 5. According to an embodiment, the preliminary semiconductor spacer 164 and a second semiconductor layer 170, which will be described below, may constitute a plugging layer TL as described in connection with FIGS. 1 to 5.

Figure 22:
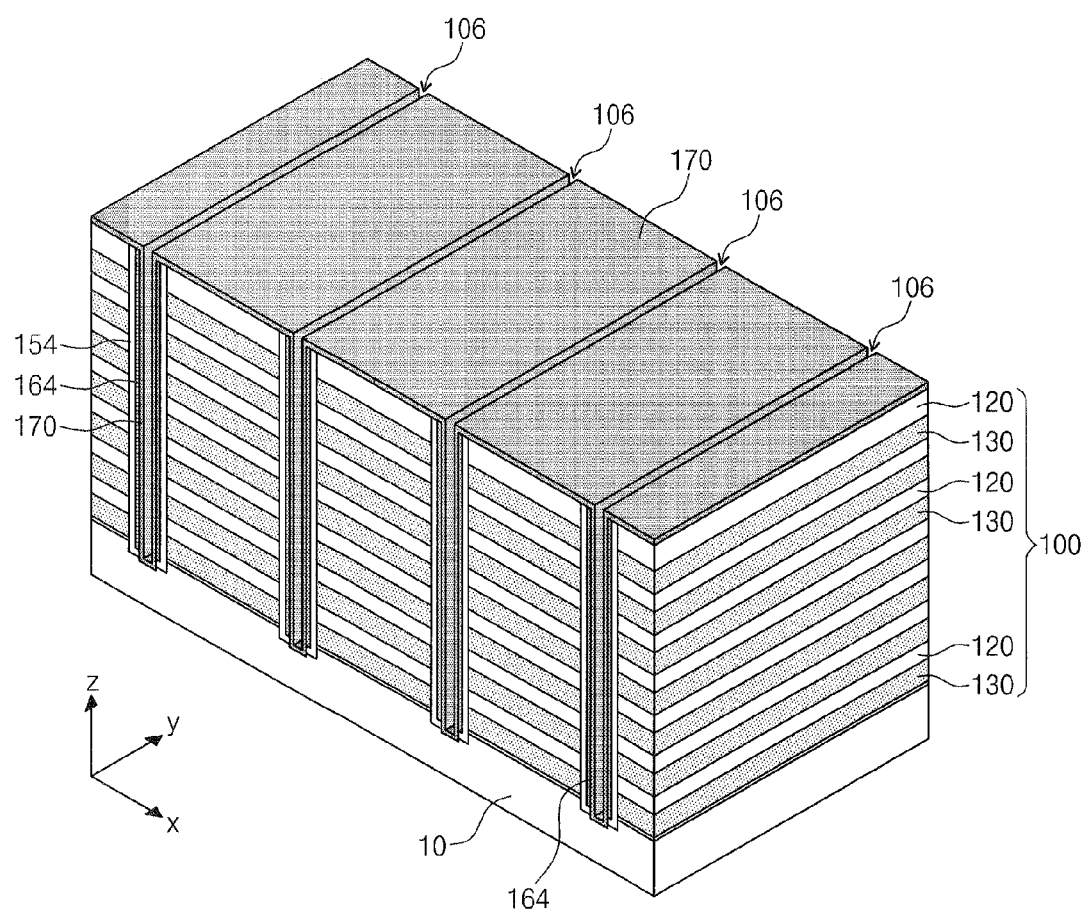
Figure 23:
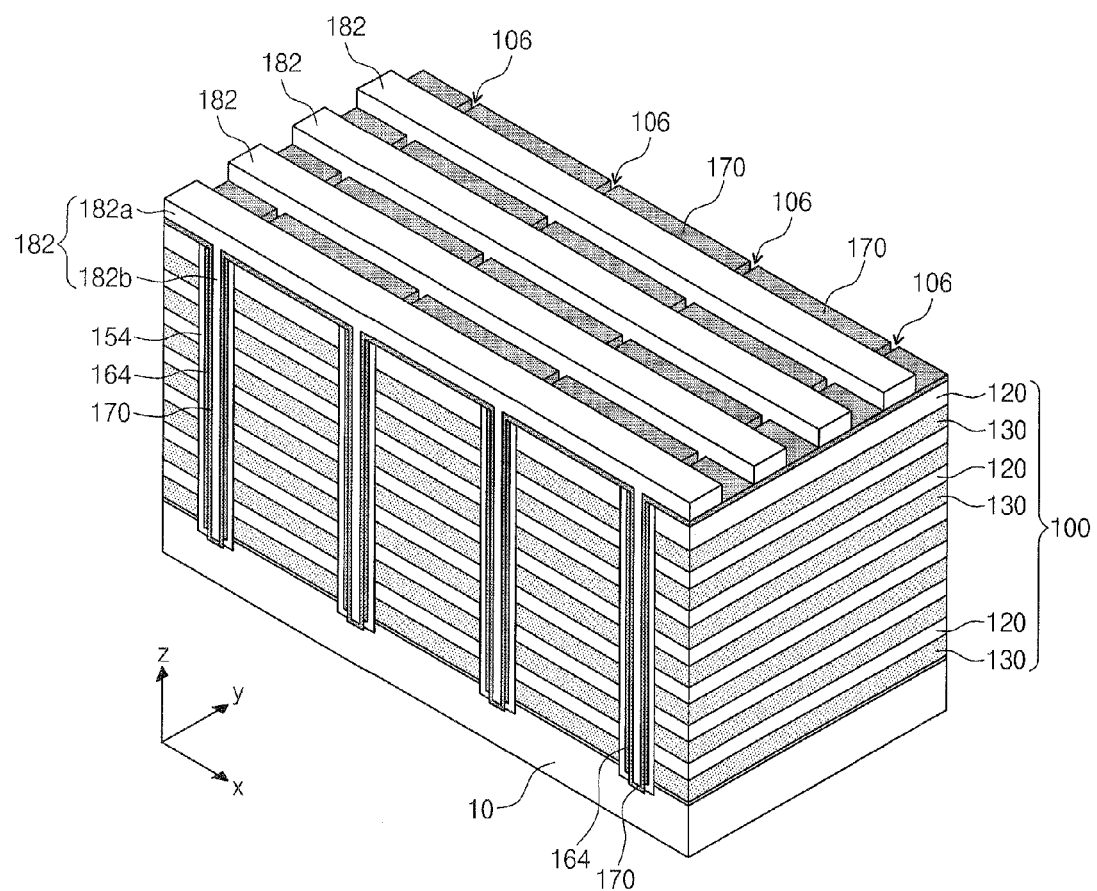

Referring to FIGS. 22 and 23, a second semiconductor layer 170 and string defining masks 182 are sequentially formed on a resultant structure in which the preliminary vertical pattern 154 is formed. According to an embodiment, the second semiconductor layer 170 may be a polycrystalline silicon layer formed using an atomic layer deposition (ALD) technology or a chemical vapor deposition (CVD) technology. According to an embodiment, the string defining mask 182 may be one of insulating materials and a silicon oxide layer formed using a silicon-on glass (SOG) technology.

Forming the string defining mask 182 includes forming a string separation layer filling the openings 106 on a resultant structure in which the second semiconductor layer 170 is formed and then patterning the string separation layer to cross the openings 106. Patterning the string separation layer includes anisotropically etching the string separation layer using an etch recipe having an etch selectivity to the second semiconductor layer 170. According to an embodiment, patterning the string separation layer may be performed to expose the second semiconductor layer 170 at bottoms of the openings 106.

As a consequence, each of the string defining masks 182 includes an upper pattern 182a crossing upper portions of the openings 106 and an extension pattern 182b downwardly extending from the upper pattern 182a to partly fill the opening 106. Surfaces of the second semiconductor layer 170 may be exposed between the extension patterns 182b. For example, according to an embodiment, the extension patterns 182b may be formed to expose sidewalls and bottom surfaces of the second semiconductor layer 170 located between the extension patterns 182b.

Figure 24:
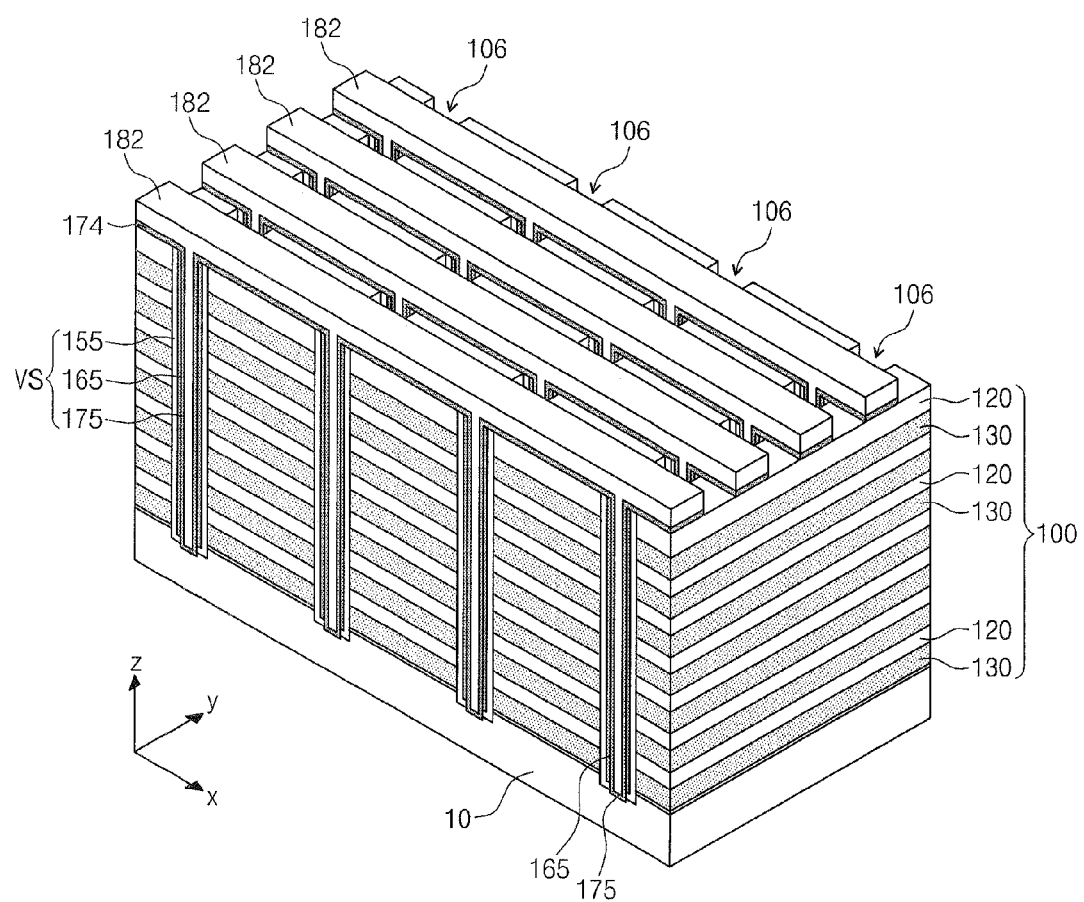

Referring to FIG. 24, the second semiconductor layer 170 and the preliminary semiconductor spacers 164 are sequentially patterned using the string defining masks 182 as an etching mask. This patterning step includes isotropically etching the second semiconductor layer 170 and the preliminary semiconductor spacers 164 using an etch recipe having an etch selectivity to the preliminary vertical pattern 154.

According to an embodiment, during the patterning step, the preliminary vertical patterns 154 are etched together and thereby sidewalls of the mold structure 100 may be exposed. According to an embodiment, the preliminary vertical patterns 154 are horizontally separated to form vertical patterns 155 two dimensionally arranged, and the preliminary semiconductor spacers 164 are horizontally separated to form semiconductor spacers 165 two dimensionally arranged. As a result of the patterning process, the second semiconductor layer 170 forms horizontally separated second semiconductor patterns 174. The second semiconductor patterns 174, as illustrated in FIG. 24, include semiconductor body portions 175 interposed between the semiconductor spacers 165 and the string defining masks 182.

Figure 35:
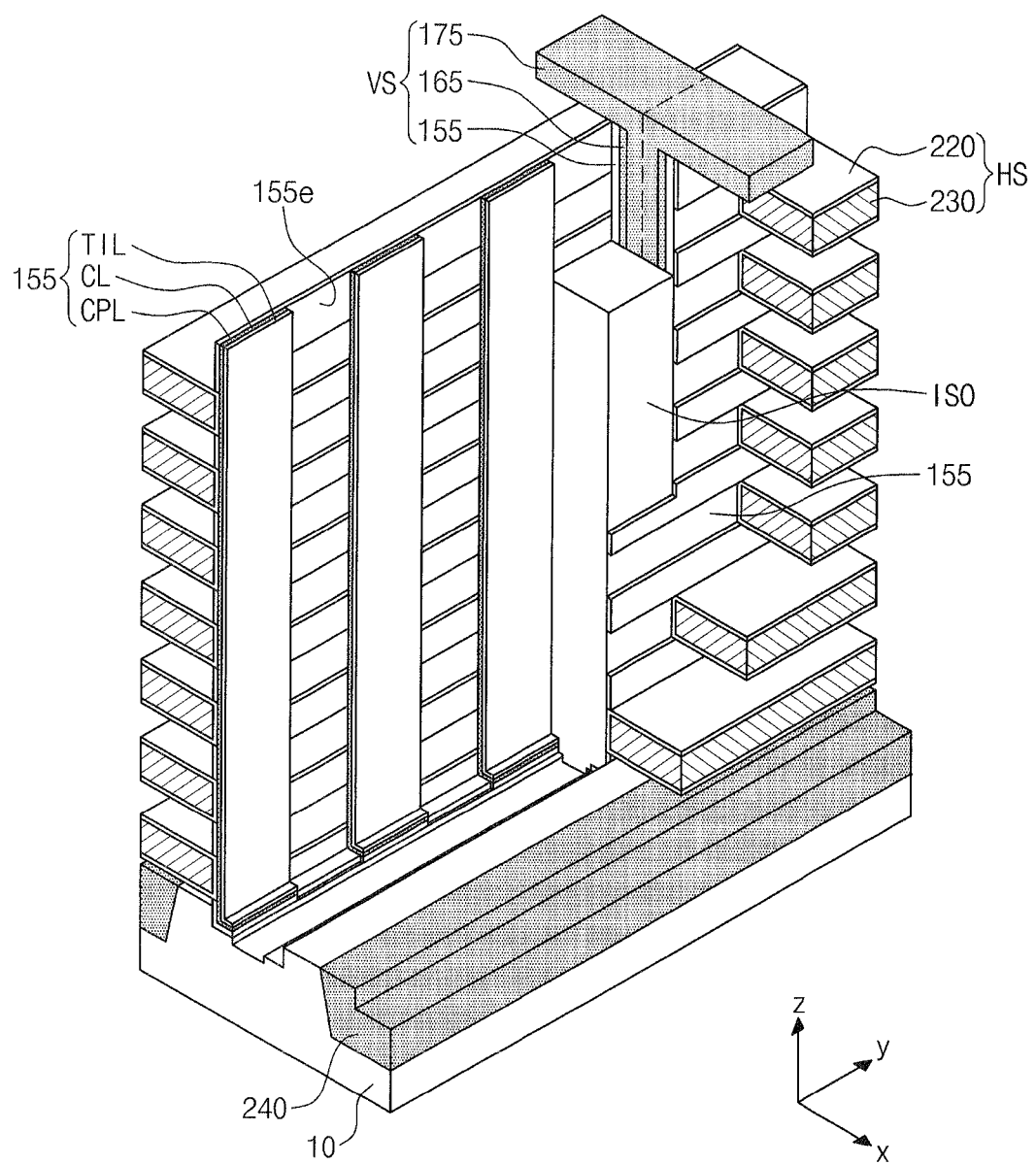

According to an embodiment, although the second semiconductor patterns 174 are separated by the patterning process, portions of the preliminary vertical patterns 154 may remain in inner walls of the openings 106. For example, according to an embodiment, the pattern process may be performed not to expose sidewalls of the mold structure 100. FIG. 35 is a perspective view illustrating a portion of final resultant structure wherein in the case that the vertical layer includes a plurality of thin layers, portions of the thin layers constituting the vertical layer or the preliminary vertical pattern 154 may remain in inner walls of the openings 106.

Figure 25:
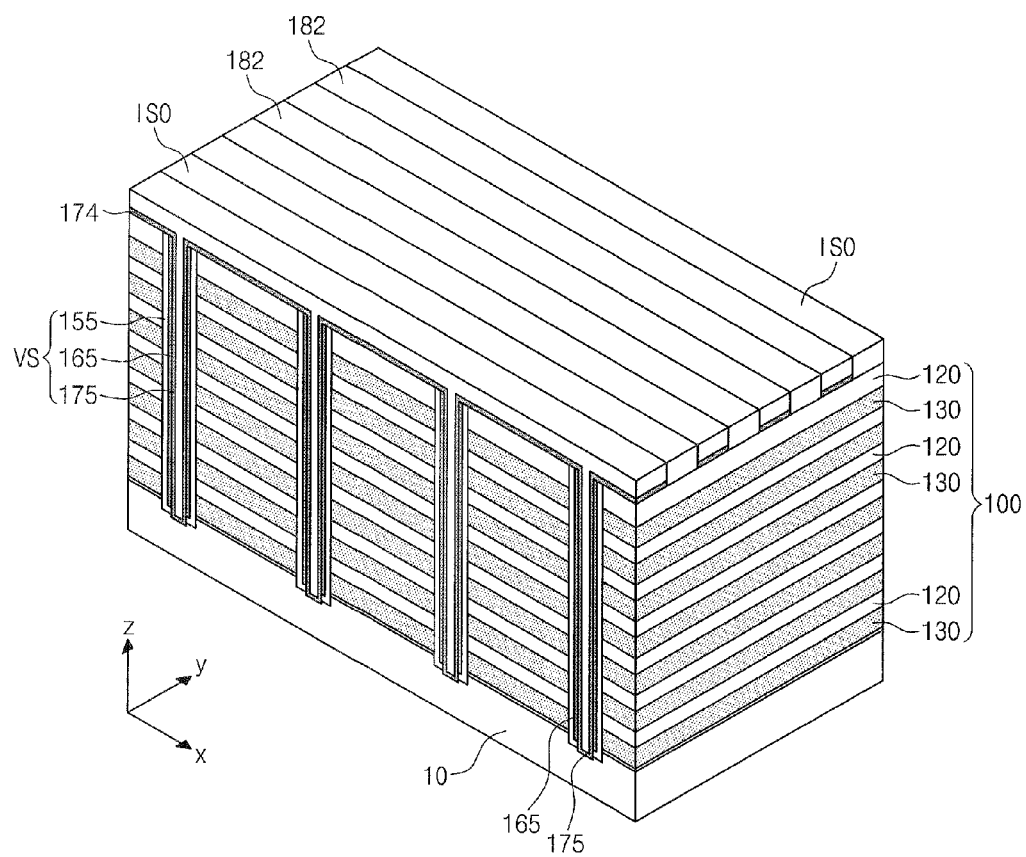
Figure 26:
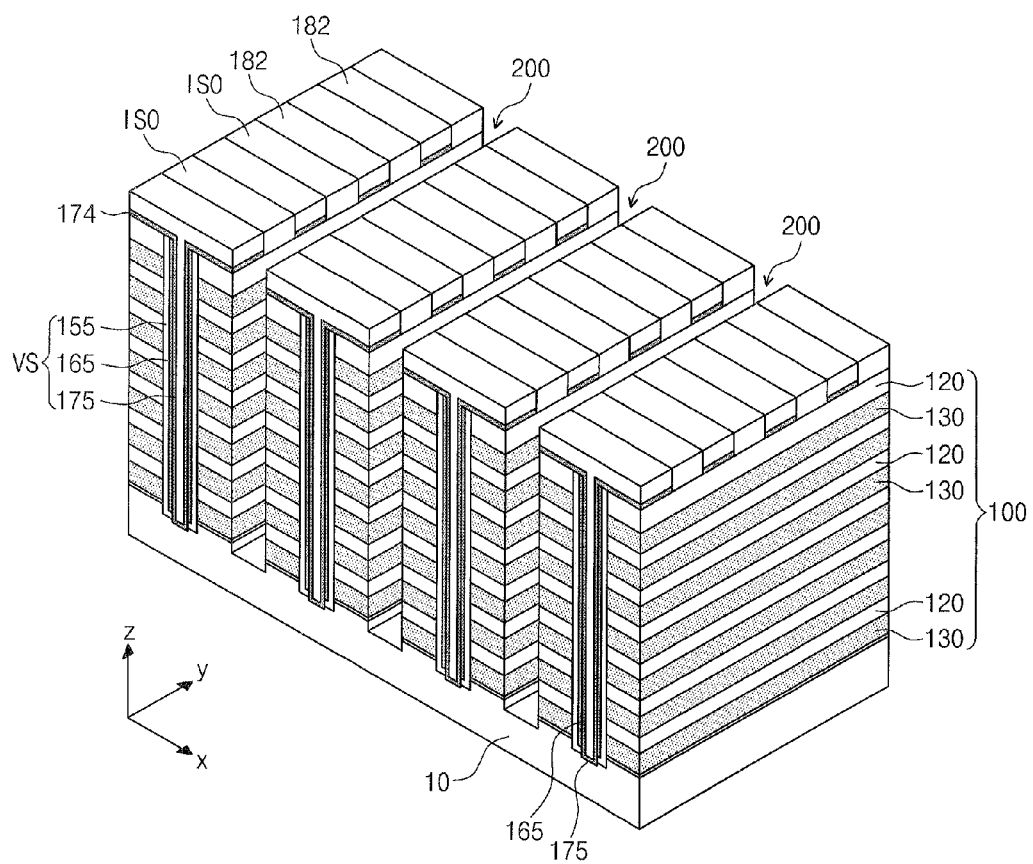

Referring to FIGS. 25 and 26, after forming string isolation layers ISO filling the openings 106 between the string defining masks 182, trenches 200 (or second openings) are formed to expose sidewalls of the sacrificial layers 130 and the insulating layers 120 while penetrating the mold structure 100.

The string isolation layers ISO are formed of at least an insulating material. The string isolation layers ISO each is formed to have a shape similar to the string defining mask 182. For example, according to an embodiment, each of the string isolation layers ISO may include an upper isolation pattern horizontally crossing the openings 106 and an extension portion (not illustrated) downwardly extending from the upper isolation pattern to fill the opening 106.

According to an embodiment, the trenches 200 may be formed to cross between the openings 105 and may be formed using the method described with reference to FIG. 15. By the trenches 200, the semiconductor body portions 175 of the second semiconductor patterns 174 are separated from one another, and the extension patterns 182b of the string defining masks 182 are separated from one another. As a result, the semiconductor body portions 175 are two dimensionally arranged on the substrate 10, similar to the vertical patterns 155 and the semiconductor spacers 165.

According to an embodiment, a plurality of vertical structures VS and a plurality of string isolation layers ISO disposed between the vertical structures VS may be disposed in an opening 106. Each of the vertical structures VS includes a semiconductor body portion 175, a pair of vertical patterns 155, and a pair of semiconductor spacers 165. According to an embodiment, the vertical structures VS each may further include the extension pattern 182b.

Figure 27:
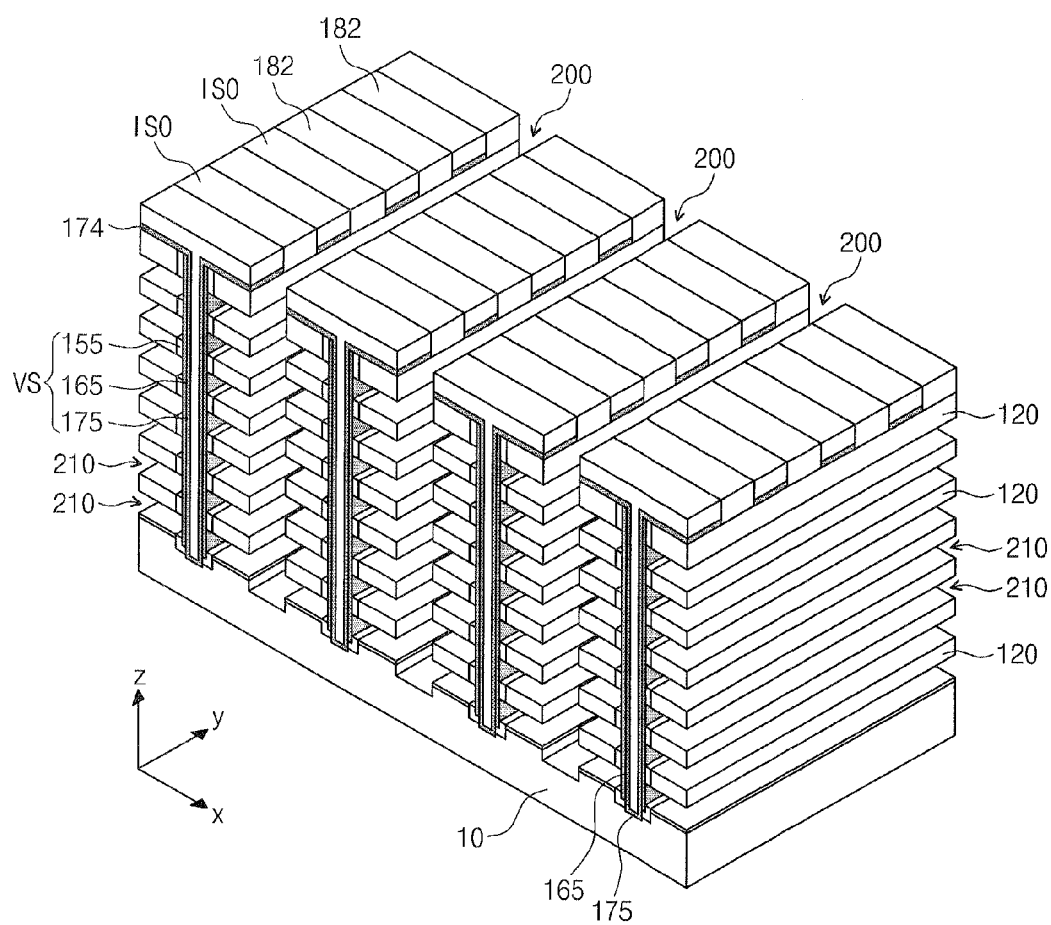
Figure 28:
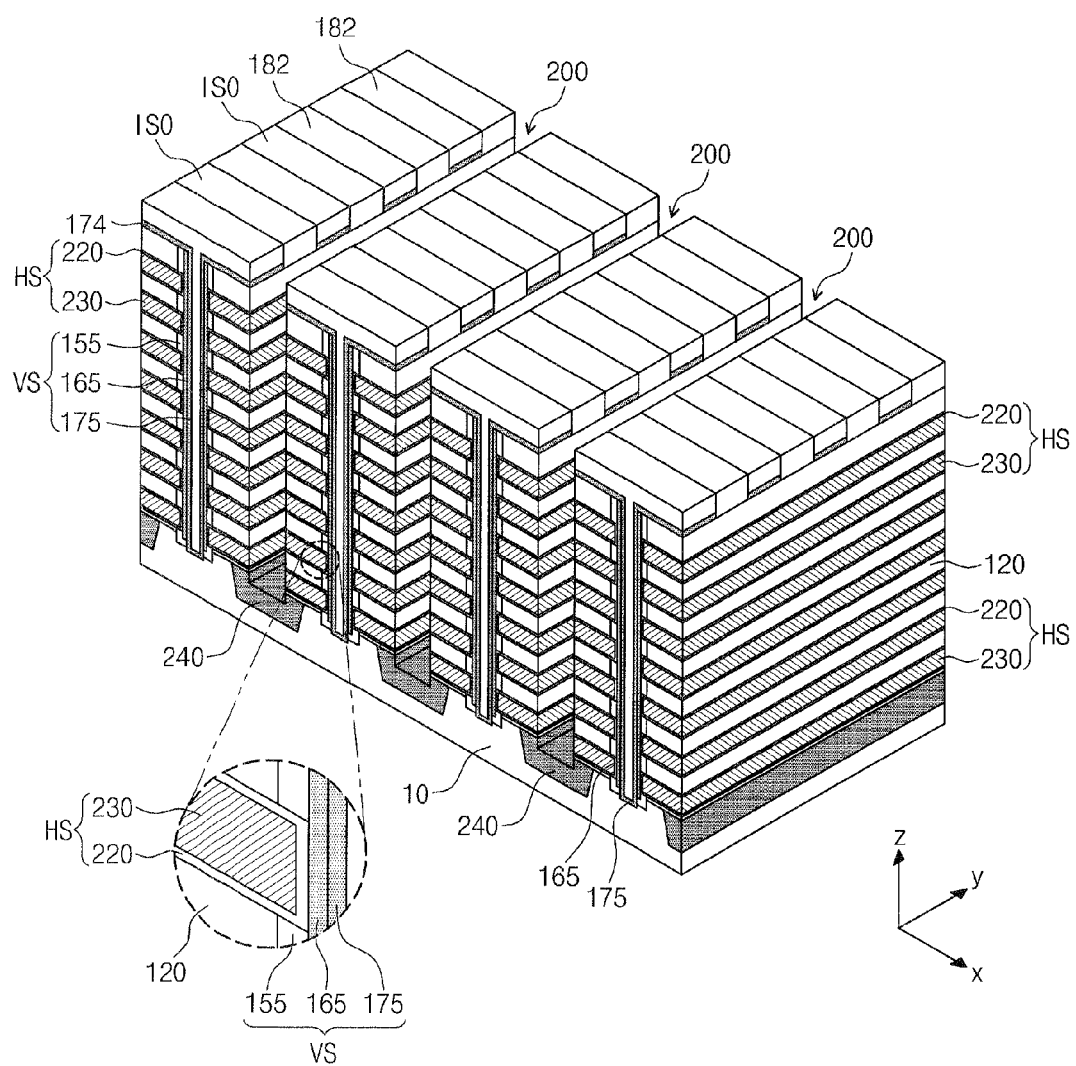

As illustrated in FIG. 27, the exposed sacrificial layers 130 are selectively removed to form recess regions 210 exposing sidewalls of the vertical patterns 155 between the insulating layers 120. Sidewalls of the semiconductor spacers 165 are exposed by etching the exposed sidewalls of the vertical patterns 155. As a result, the vertical patterns 155 are vertically separated from one another and each of the vertical patterns 155 is a ring shaped pattern that is locally disposed between the sidewalls of the insulating layers 120 and the semiconductor spacer 165. Thereafter, as illustrated in FIG. 28, horizontal structures HS are formed to fill the recess regions 210. According to an embodiment, forming the recess regions 210 and exposing the sidewalls of the semiconductor spacers 165 may be performed using the method described with reference to FIG. 16. According to an embodiment, the horizontal structures HS may be formed using the method described with reference to FIG. 17.

As a consequence, the horizontal structure HS may include a horizontal pattern 220 (or an intermediate pattern) covering an inner wall of the recess region 210 and a conductive pattern 230 filling the remaining space of the recess region 210. As illustrated in FIG. 28, after forming the conductive patterns 230, impurity regions 240 are further formed in the substrate 10 exposed through the trenches 200.

Figure 29:
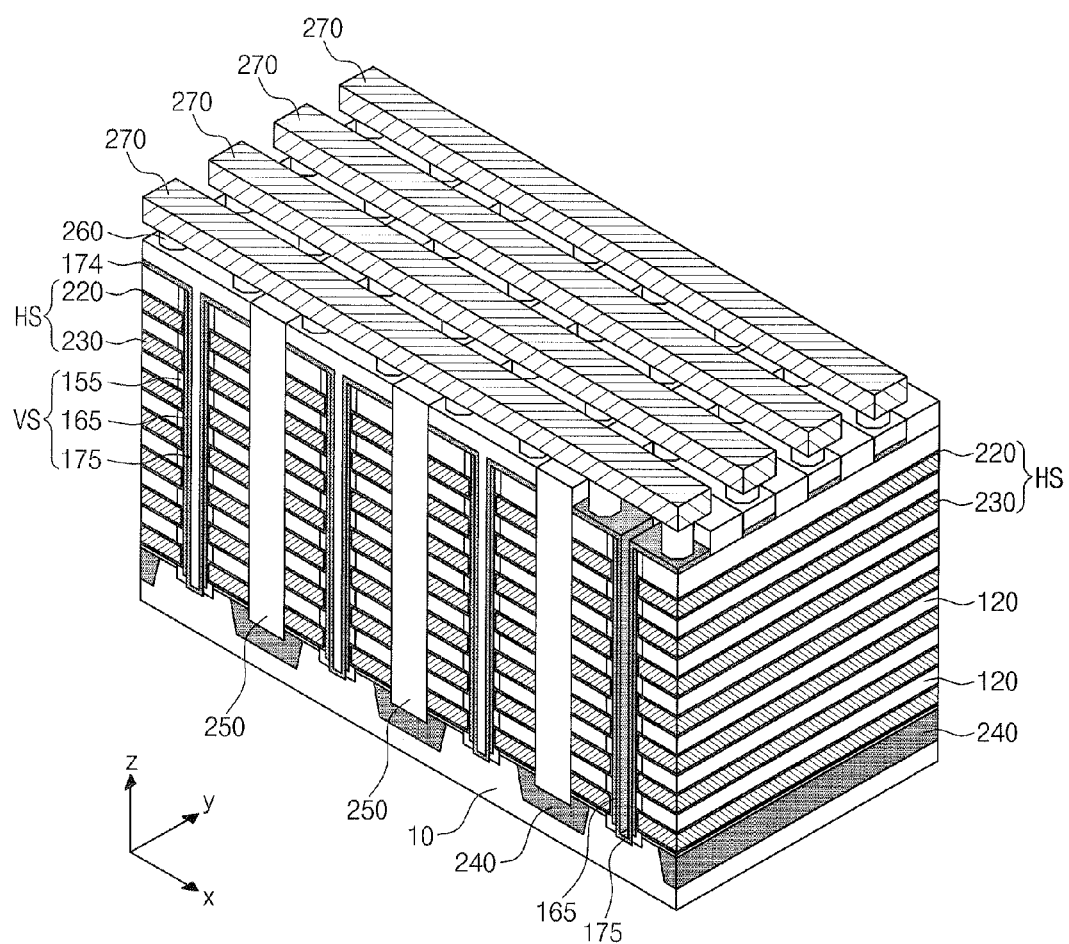

After that, as illustrated in FIG. 29, electrode separation patterns 250 filling the trenches 200, upper plugs 260 connected to the respective vertical structures VS, and upper interconnections 270 connecting the upper plugs 260 to one another are formed. According to an embodiment, the electrode separation patterns 250, the upper plugs 260, and the upper interconnections 270 may be formed using the method described with reference to FIGS. 18 and 19.

Hereinafter, three dimensional semiconductor devices according to embodiments of the inventive concept will be described with reference to FIGS. 30 through 35. As shown in FIGS. 30 through 35, for brevity of the description and for better understanding of the embodiments of the inventive concept well, some of elements constituting a three dimensional semiconductor device have been omitted from the drawings.

Figure 30:
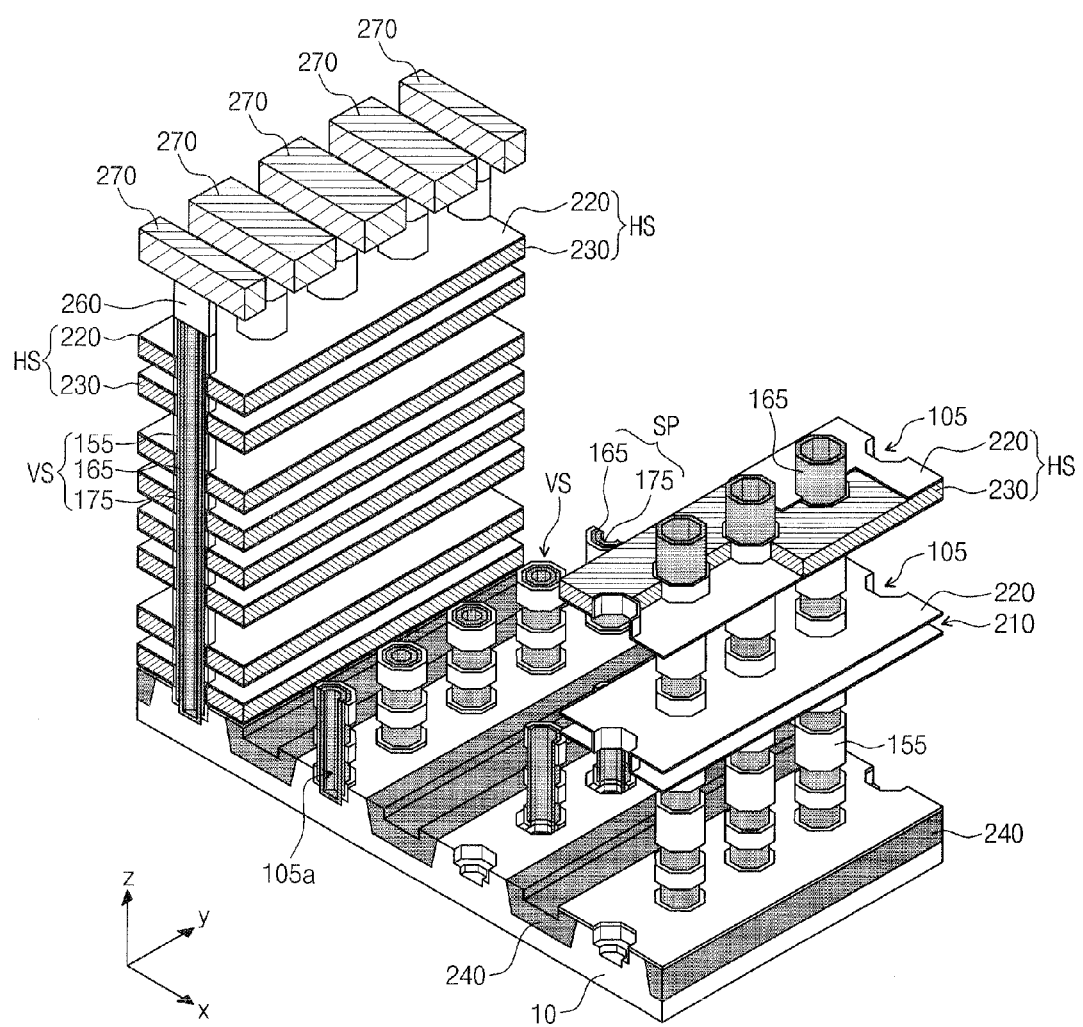
FIG. 30 is a perspective view for describing a three dimensional semiconductor device according to an embodiment of the inventive concept.
Figure 31:
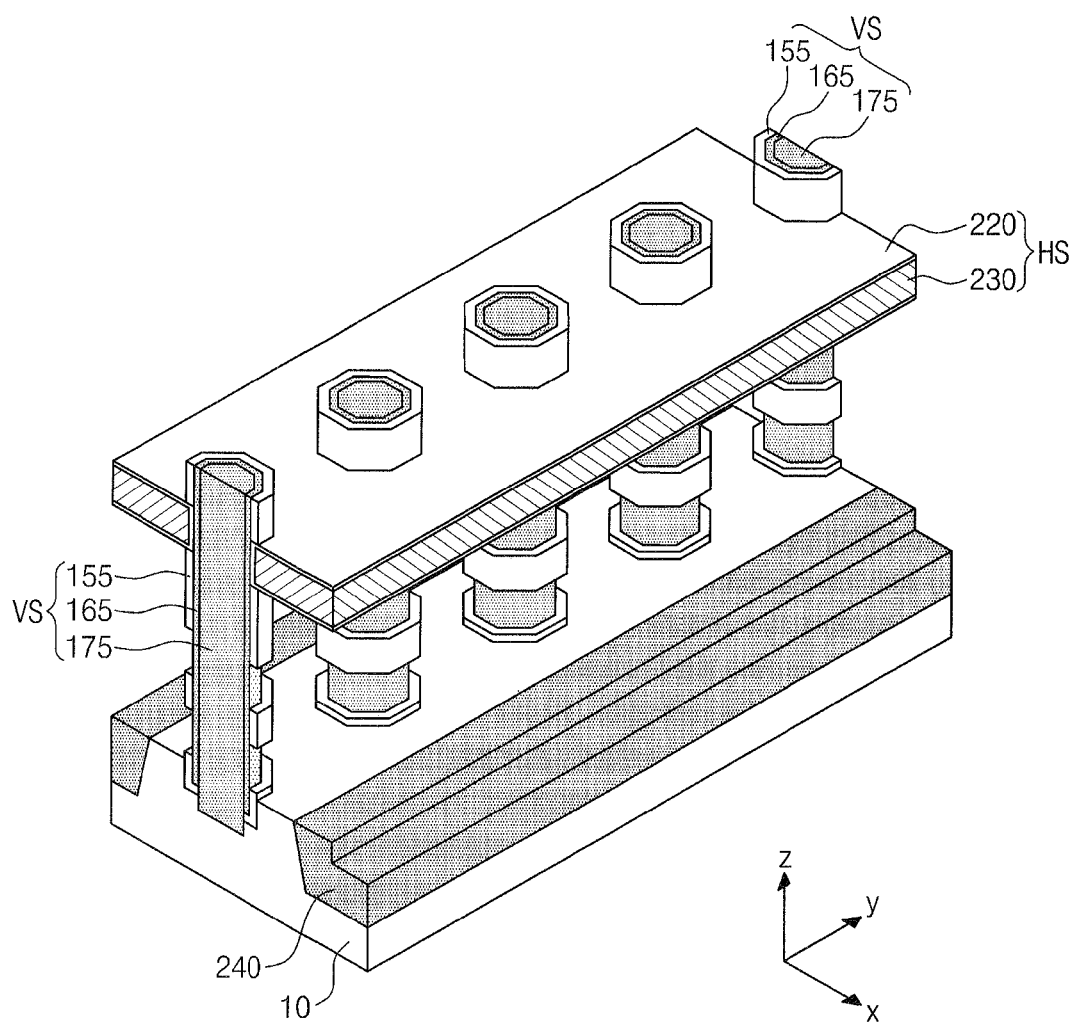
FIGS. 31 and 32 are perspective views for describing a three dimensional semiconductor device according to an embodiment of the inventive concept.

FIG. 30 is a perspective view for describing a three dimensional semiconductor device according to an embodiment of the inventive concept. FIGS. 31 and 32 are perspective views for describing a three dimensional semiconductor device according to embodiments of the inventive concept.

Referring to FIG. 30, horizontal structures HS are three dimensionally arranged on a substrate 10 and vertical structures VS vertically penetrating the horizontal structures HS are two dimensionally arranged on the substrate 10.

Each of the horizontal structures HS includes a conductive pattern 230 and a horizontal pattern 220 (or an intermediate pattern). The conductive pattern 230 is disposed to be parallel to a top surface (for example, an xy plane) of the substrate 10. A plurality of openings 105 penetrated by the vertical structures VS are formed in the conductive patterns 230. The horizontal pattern 220 is interposed between the conductive pattern 230 and the vertical structures VS. For example, the horizontal pattern 220 may cover an inner sidewall of the conductive pattern 230 or sidewalls of the openings 105. According to an embodiment, the horizontal patterns 220 horizontally extend from the openings 105 to cover top surfaces and bottom surfaces of the conductive patterns 230.

According to an embodiment, the conductive pattern 230 may include at least one of doped silicon, metal materials, metal nitride layers, and metal silicide. For example, according to an embodiment, the conductive pattern 230 may include a tantalum nitride layer or tungsten. According to an embodiment, the horizontal pattern 220 may include a single thin layer or a plurality of thin layers. According to an embodiment, the horizontal pattern 220 may include a blocking insulating layer used as a memory element of a charge trap type nonvolatile memory transistor. According to an embodiment, the horizontal pattern 220 may include a tunnel insulating layer, a charge storage layer, and a blocking insulating layer used as a memory element of the charge trap type nonvolatile memory transistor.

Each of the vertical structures VS includes a semiconductor pattern SP connected to a top surface of the substrate 10 and a vertical pattern 155 interposed between the semiconductor pattern SP and the horizontal structures HS. According to an embodiment, the semiconductor pattern SP may include a semiconductor spacer 165 and a semiconductor body portion 175. The semiconductor spacer 165 has a cylindrical shape with open upper and lower portions. The semiconductor body portion 175 has a cup shape that covers an inner wall of the semiconductor spacer 165 and a top surface of the substrate 10. For example, the semiconductor body portion 175 is formed to have a thickness not to completely fill the opening 105 and thereby a pin hole 105a may be defined inside the semiconductor body portion 175. According to an embodiment, the pin holes 105a may be filled with gap-fill insulating patterns 185.

The vertical pattern 155 may have a ring-shaped pattern that is disposed between the conductive patterns 230. According to an embodiment, this may be a result obtained by etching a surface of the vertical pattern 155 exposed by the recess region 210 as described with reference to FIGS. 16 through 27. The vertical pattern 155 adjacent to the substrate 10 may include a bottom portion extending under the semiconductor spacer 165.

According to an embodiment, the semiconductor pattern SP may be one of materials having a semiconductor property. For example, according to an embodiment, each of the semiconductor spacer 165 and the semiconductor body portion 175 may include one of polycrystalline silicon, an organic semiconductor layer, and a carbon nano structure. According to an embodiment, the vertical pattern 155 may include a single thin layer or a plurality of thin layers. According to an embodiment, the vertical pattern 155 may be formed of at least one of materials having an etch selectivity to the semiconductor pattern SP.

The horizontal structures HS and the vertical structures VS define localized intersecting regions (channel regions) between the horizontal structures HS and the vertical structures VS, vertical adjacent regions vertically adjacent to the localized intersecting regions, and horizontal adjacent regions horizontally adjacent to the localized intersecting regions. The vertical adjacent regions are defined as sidewalls of the vertical structures VS located between the horizontal structures HS, and the horizontal adjacent regions are defined as surfaces of the horizontal structures HS located between the vertical structures VS. According to an embodiment of the inventive concept, the horizontal pattern 220 and the vertical pattern 155 are disposed in the localized intersecting regions but the horizontal pattern 220 may extend in the horizontal adjacent regions.

Referring to FIG. 31, the semiconductor body portion 175 is formed to completely fill the opening 105 including the semiconductor spacer 165. According to an embodiment, a void may be formed inside the semiconductor body portion 175.

According to an embodiment, the semiconductor body portion 175 or the semiconductor spacer 165 may have a different crystal structure from a polycrystalline silicon structure formed through a chemical vapor deposition (CVD) by changing a crystal structure using, e.g., an epitaxial technology including a laser annealing step. For example, according to an embodiment, the semiconductor body portion 175 or the semiconductor spacer 165 may be formed so that a lower region and an upper region thereof have different grain sizes from each other. According to an embodiment, the semiconductor body portion 175 and the semiconductor spacer 165 may have the same or substantially the same technical features related to a crystal structure.

Referring to FIG. 32, an under-cut region 77 is formed under the semiconductor spacer 165 to define a bottom surface of the vertical pattern 155. This structure, as described with reference to FIG. 12, may be obtained by isotropically etching a lower region of the vertical pattern 155 using the semiconductor spacer 165 as an etching mask. The under-cut region 77 is filled with the semiconductor body portion 175. According to an embodiment, the vertical structures VS may have the same or substantially the same technical features related to the under-cut region 77.

Figure 33:
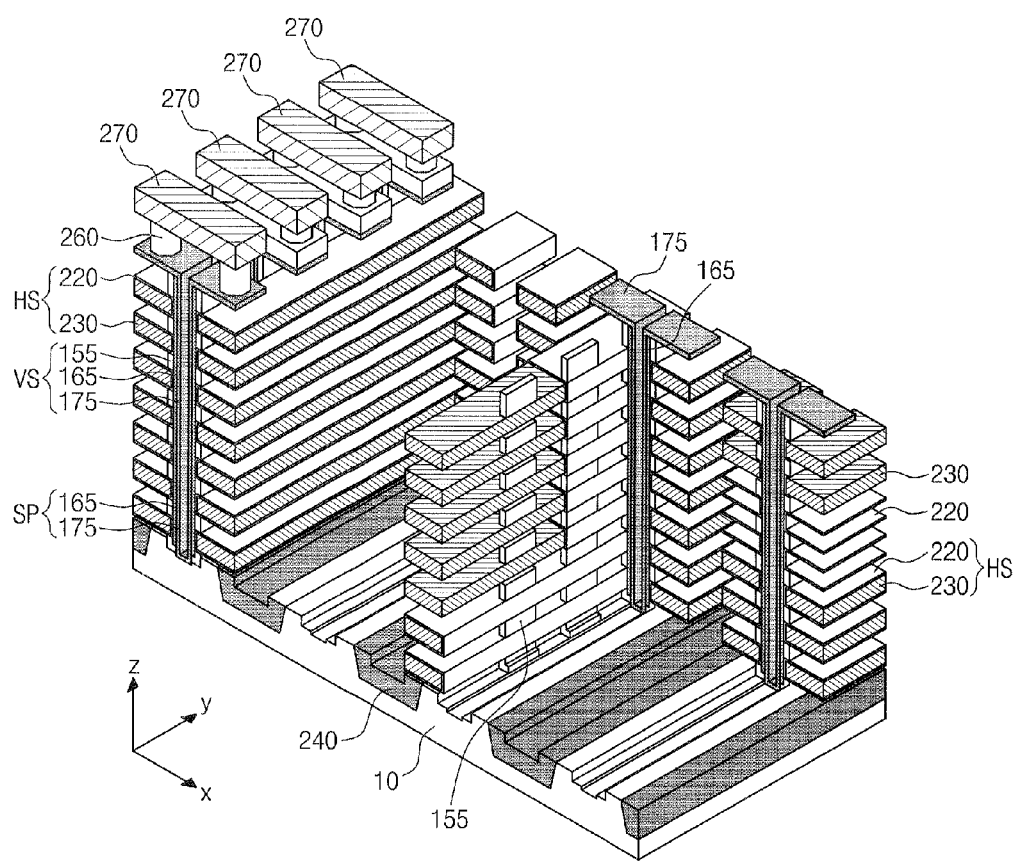
FIG. 33 is a perspective view for describing a three dimensional semiconductor device according to an embodiment of the inventive concept.
Figure 34:
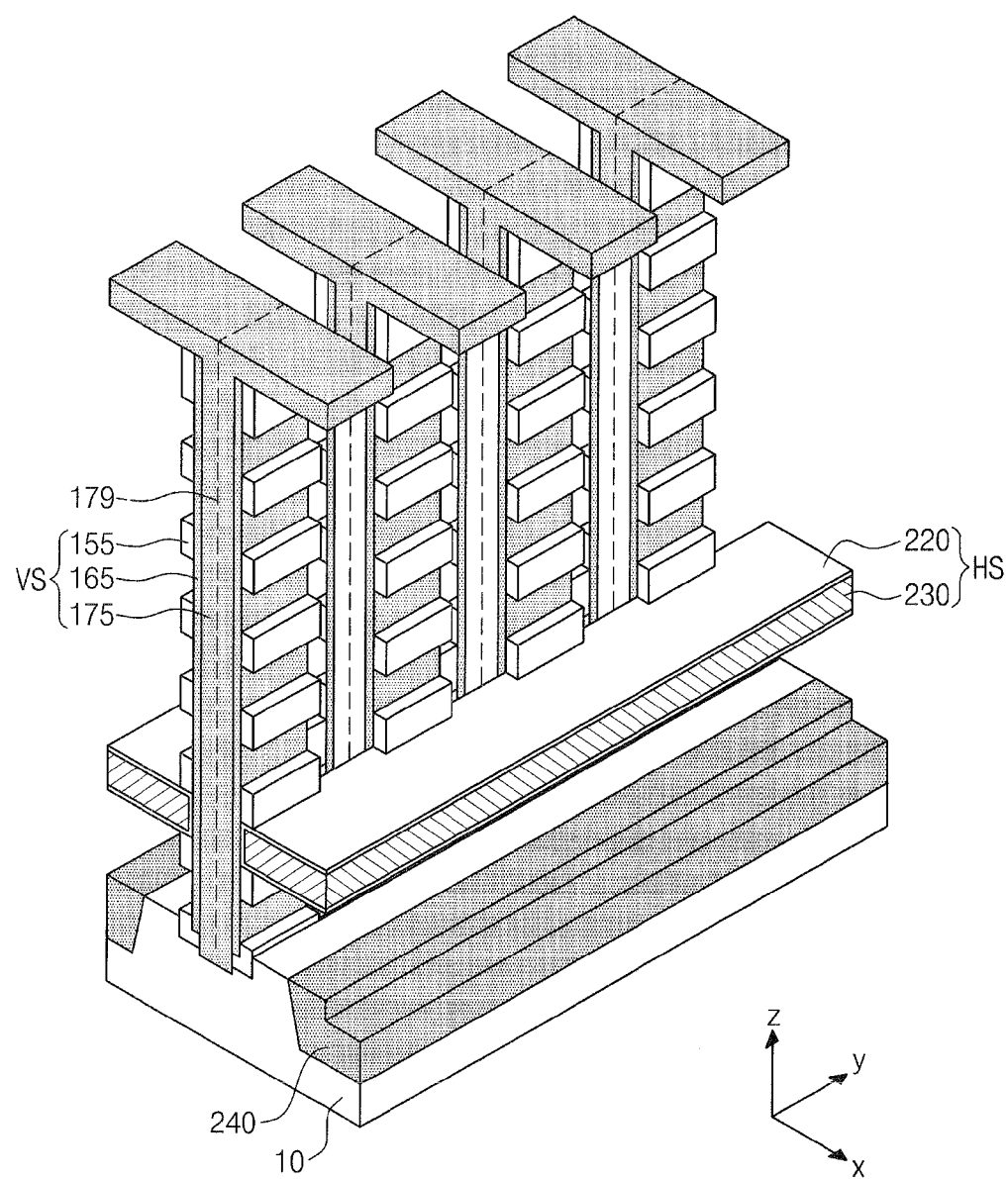
FIGS. 34 and 35 are perspective views for describing a three dimensional semiconductor device according to an embodiment of the inventive concept.

FIG. 33 is a perspective view for describing a three dimensional semiconductor device according to an embodiment of the inventive concept. FIGS. 34 and 35 are perspective views for describing a three dimensional semiconductor device according to embodiments of the inventive concept.

Referring to FIG. 33, horizontal structures HS are three dimensionally arranged on a substrate 10, and vertical structures VS are disposed between the horizontal structures HS. The vertical structures VS are two dimensionally arranged on the substrate 10 to face sidewalls of the horizontal structures HS.

Each of the horizontal structures HS includes a conductive pattern 230 and a horizontal pattern 220 (or an intermediate pattern). The conductive pattern 230 may be formed to be parallel to a top surface (for example, an xy plane) of the substrate 10. The horizontal pattern 220 is disposed between the conductive pattern 230 and the vertical structures VS and horizontally extends to cover a top surface and a bottom surface of the conductive pattern 230. A sidewall of the conductive pattern 230 that is located opposite to the vertical structure VS is not covered with the horizontal pattern 220. For example, according to an embodiment, a cross section of the horizontal pattern 220 as viewed from an xz plane may have a "U" shape.

Each of the vertical structures VS includes a semiconductor pattern SP connected to a top surface of the substrate 10 and a vertical pattern 155 interposed between the semiconductor pattern SP and the horizontal structures HS. According to an embodiment, a semiconductor pattern SP may include a pair of semiconductor spacers 165 and a semiconductor body portion 175 disposed between the pair of semiconductor spacers 165.

The semiconductor body portion 175 includes a pair of sidewall portions vertically crossing the horizontal structures HS and a bottom portion connecting bottom surfaces of the sidewall portions. For example, the semiconductor body portion 175 includes a portion of which a cross section has a horseshoe shape. Each of the semiconductor spacers 165 includes a hexahedral part between a sidewall portion of the semiconductor body portion 175 and the vertical pattern 155. According to an embodiment, X-directional thicknesses of the sidewall portions of the semiconductor body portion 175 and the semiconductor spacer 165 may be smaller than a space between a pair of conductive patterns 230 horizontally adjacent to each other. According to an embodiment, the extension patterns 182b of the string defining masks 182, as illustrated in FIG. 23, may be disposed between the sidewall portions of the semiconductor body portions 175.

According to an embodiment, the vertical pattern 155 may have a hexahedral shape disposed between the conductive patterns 230 and an x direction thickness of the vertical pattern 155 may be smaller than a space between a pair of conductive patterns 230 horizontally adjacent to each other. The vertical pattern 155 adjacent to the substrate 10 further includes a bottom portion extending under the semiconductor spacer 165.

Referring to FIGS. 34 and 35, the semiconductor body portion 175 is formed to completely fill an opening 105 including the semiconductor spacer 165. According to an embodiment, a discontinuous interface 179 or void may be formed inside the semiconductor body portion 175. As described with reference to FIG. 31, according to an embodiment, the semiconductor body portion 175 or the semiconductor spacer 165 may go through a change in a crystal structure using, e.g., an epitaxial technology including a laser annealing step to have a different crystal structure from a polycrystalline silicon structure formed through a chemical vapor deposition (CVD) process.

Referring to FIG. 35, according to an embodiment, the vertical pattern 155, as described with reference to FIG. 24, may include a horizontal extension portion 155e extending horizontally. For example, the horizontal extension portion 155e is disposed between the semiconductor body portions 175 horizontally adjacent to each other and contacts a sidewall of the string isolation layer ISO.

Figure 38:
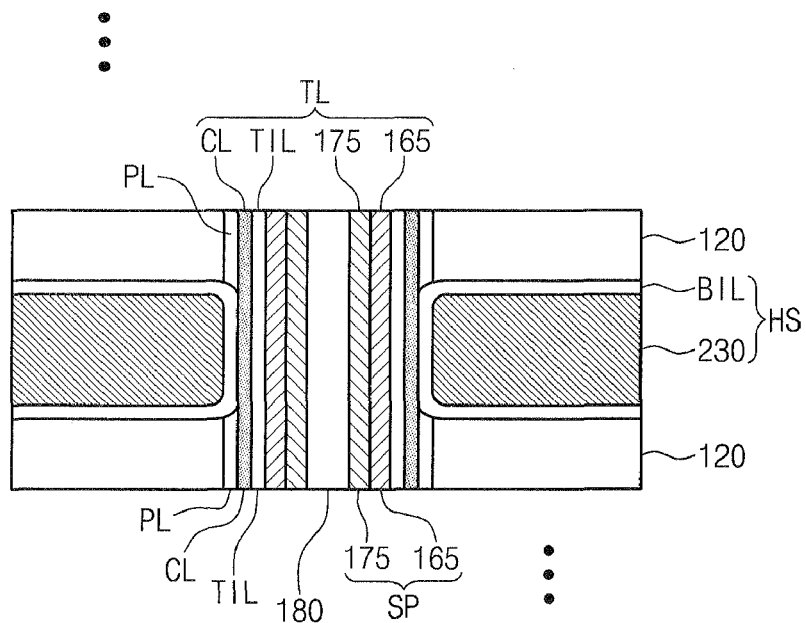
Figure 39:
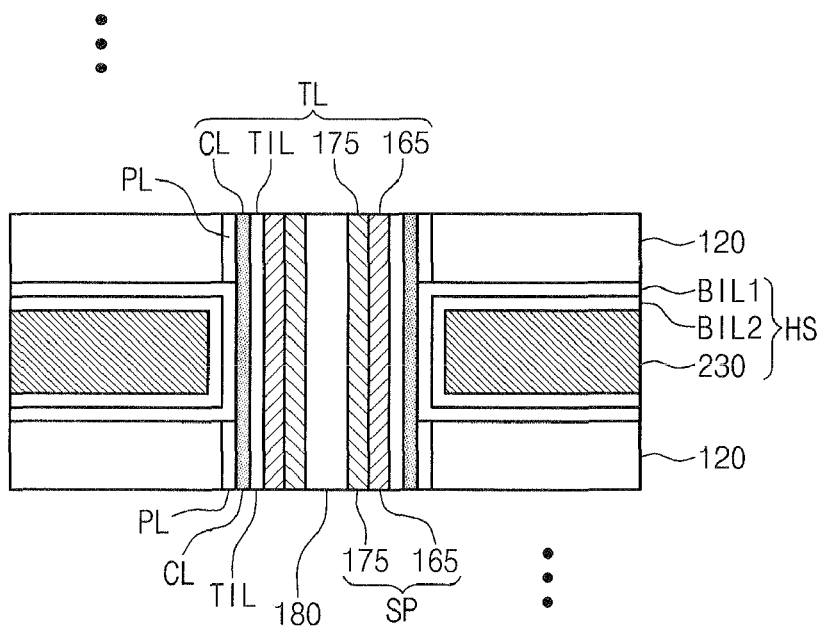
Figure 40:
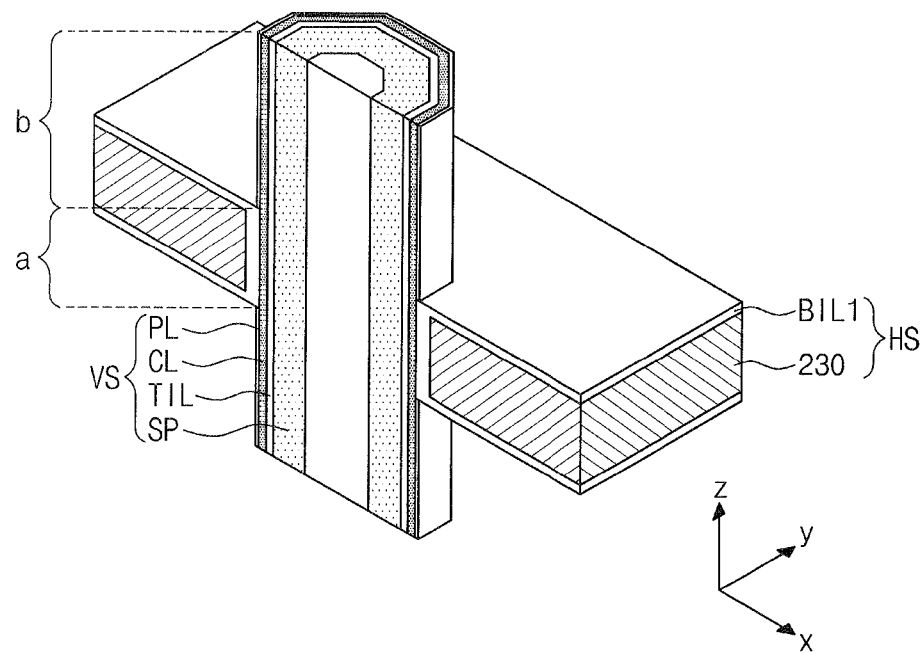
FIGS. 40 and 41 are perspective views illustrating a portion of a three dimensional semiconductor device manufactured by methods according to embodiments of the inventive concept.
Figure 41:
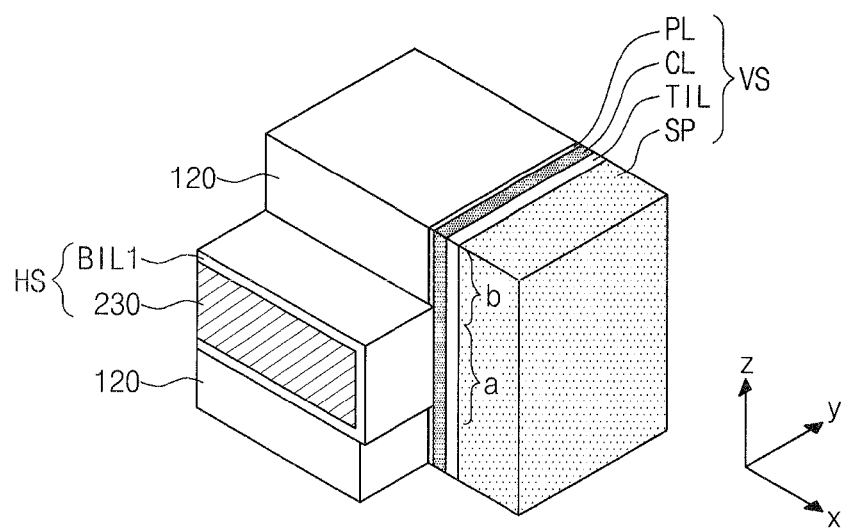

FIGS. 36 through 39 are cross-sectional views each illustrating a portion of a three dimensional semiconductor device according to embodiments of the inventive concept. FIGS. 40 and 41 are perspective views illustrating a portion of a three dimensional semiconductor device manufactured by the methods described with reference to FIGS. 9 through 29.

Referring to FIGS. 36 through 39, according to an embodiment, the plugging layer TL may include a charge storage layer CL, a semiconductor pattern SP, and a tunnel insulating layer TIL disposed between the charge storage layer CL and the semiconductor pattern SP. A gap-fill insulating layer 180 fills an inside of the semiconductor pattern SP. The semiconductor pattern SP includes a semiconductor body portion 175 adjacent to the gap-fill insulating layer 180 and a semiconductor spacer 165 adjacent to the tunnel insulating layer TIL.

The horizontal structure HS includes a conductive pattern 230 and a blocking insulating layer BIL (or an intermediate pattern) interposed between the conductive pattern 230 and the plugging layer TL. The blocking insulating layer BIL extends from between the conductive pattern 230 and the plugging layer TL to cover a top surface and a bottom surface of the conductive pattern 230. According to an embodiment, the blocking insulating layer BIL may include a plurality of thin layers. For example, according to an embodiment, as illustrated in FIG. 39, the blocking insulating layer BIL may include a first blocking insulating layer BIL1 and a second blocking insulating layer BIL2.

Figure 36:
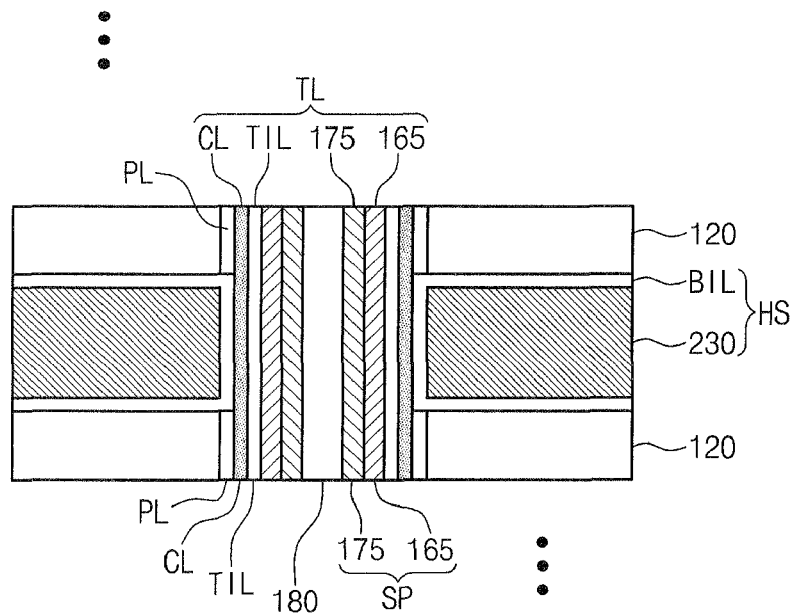
FIGS. 36 through 39 are cross-sectional views each illustrating a portion of a three dimensional semiconductor device according to embodiments of the inventive concept.
Figure 37:
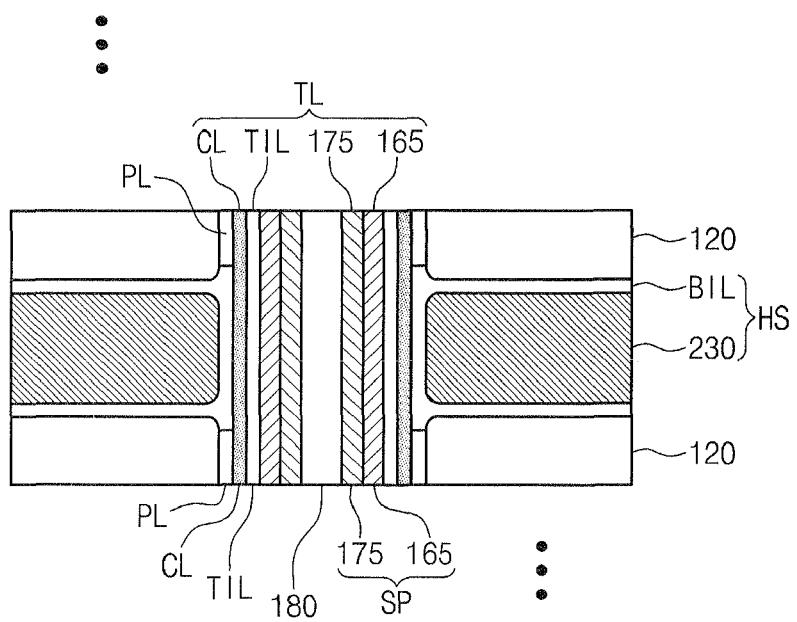

The protective layer PL is interposed between sidewalls of the insulating layer 120 and the plugging layer TL. According to an embodiment, the protective layer PL, as illustrated in FIG. 36, may have substantially the same vertical thickness as the insulating layer 120. According to an embodiment, as illustrated in FIG. 37, the protective layer PL may have a vertical thickness smaller than a vertical thickness of the insulating layer 120 so that the blocking insulating layer BIL may extend between sidewalls of the insulating layer 120 and the plugging layer TL. According to an embodiment, as illustrated in FIG. 38, the protective layer PL has a vertical thickness greater than a vertical thickness of the insulating layer 120 so that a vertical thickness of the horizontal structure HS at a position adjacent to the insulating layer 120 may be greater than a vertical thickness of the horizontal structure HS at a position adjacent to the protective layer PL.

According to an embodiment, the charge storage layer CL may be an insulating layer with many trap sites or an insulating layer including nano particles. According to an embodiment, the charge storage layer CL may be formed using a chemical vapor deposition (CVD) method or an atomic layer deposition (ALD) method. For example, according to an embodiment, the charge storage layer CL may include one of a trap insulating layer and an insulating layer including a floating gate electrode or conductive nano dots. More specifically, the charge storage layer CL may include at least one of a silicon nitride layer, a silicon oxynitride layer, a silicon-rich nitride layer, nanocrystalline silicon, or a laminated trap layer.

According to an embodiment, the tunnel insulating layer TIL may be a material having a band gap greater than a band gap of the charge storage layer CL and may be formed using a chemical vapor deposition (CVD) method or an atomic layer deposition (ALD) method. For example, according to an embodiment, the tunnel insulating layer TIL may be a silicon oxide layer formed using one of the deposition technologies described above. According to an embodiment, after the deposition process, the tunnel insulating layer TIL may further go through a predetermined heat treatment that may be a rapid thermal nitridation (RTN) process or an annealing process performed under an atmosphere including at least one of oxygen or nitrogen.

In the case that the blocking insulating layer BIL includes a first blocking insulating layer BIL1 and a second blocking insulating layer BIL2, the first and second blocking insulating layers BIL1 and BIL2 may be formed of different materials from each other. According to an embodiment, one of the first and second blocking insulating layers BIL1 and BIL2 or the blocking insulating layer BIL may be a material having a band gap smaller than a band gap of the tunnel insulating layer TIL and greater than a band gap of the charge storage layer CL. According to an embodiment, the first blocking insulating layer BIL1 may be a high dielectric layer, such as an aluminum oxide layer or a hafnium oxide layer, and the second blocking insulating layer BIL2 may be a material having a dielectric constant smaller than a dielectric constant of the first blocking insulating layer BIL1. According to an embodiment, the second blocking insulating layer BIL2 may be a high dielectric layer and the first blocking insulating layer BIL1 may be a material having a dielectric constant smaller than a dielectric constant of the second blocking insulating layer BIL2. According to an embodiment, a blocking insulating layer (not illustrated) may be further formed between the charge storage layer CL and the conductive pattern 230 besides the first and second blocking insulating layers BIL1 and BIL2.

The protective layer PL is a material having an etch selectivity to the charge storage layer CL or the sacrificial layer 130. For example, according to an embodiment, in the case that the sacrificial layer 130 is a silicon nitride layer, the protective layer PL may be a silicon oxide layer. According to an embodiment, when removing the sacrificial layer 130 for forming the recess regions 210, the protective layer PL may function as an etch stop layer to prevent the charge storage layer CL from being damaged by etching.

Figure 42:
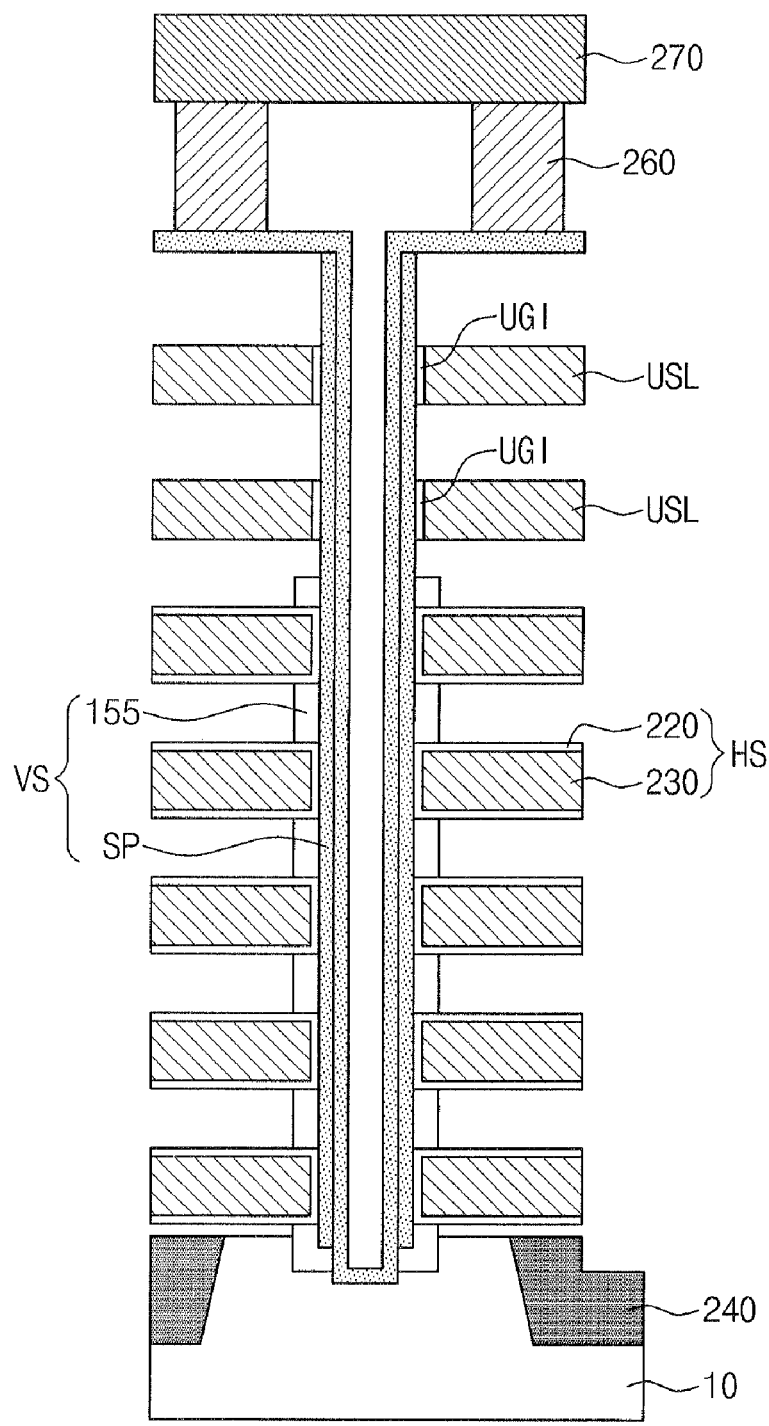
FIGS. 42 and 44 are cross-sectional views for describing a three dimensional semiconductor device according to embodiments of the inventive concept.
Figure 44:
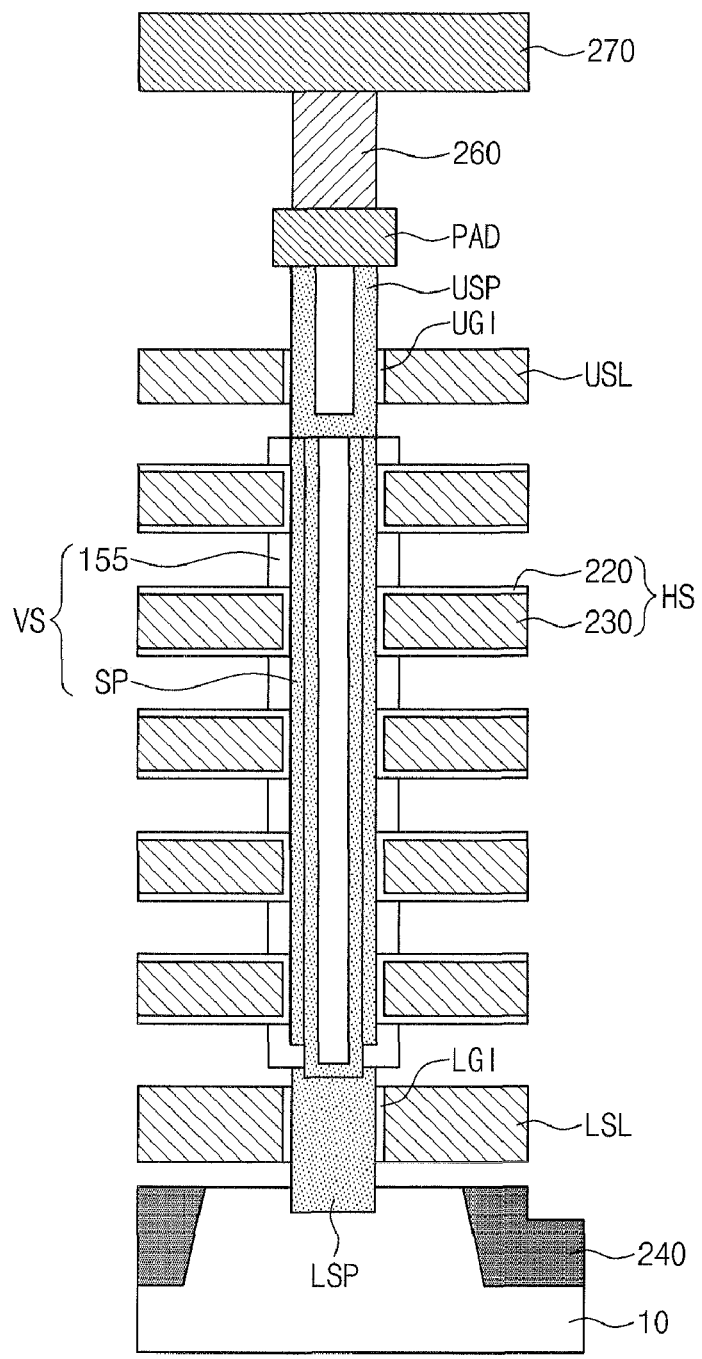

FIGS. 42 and 44 are cross-sectional views for describing a three dimensional semiconductor device according to embodiments of the inventive concept.

Figure 43:
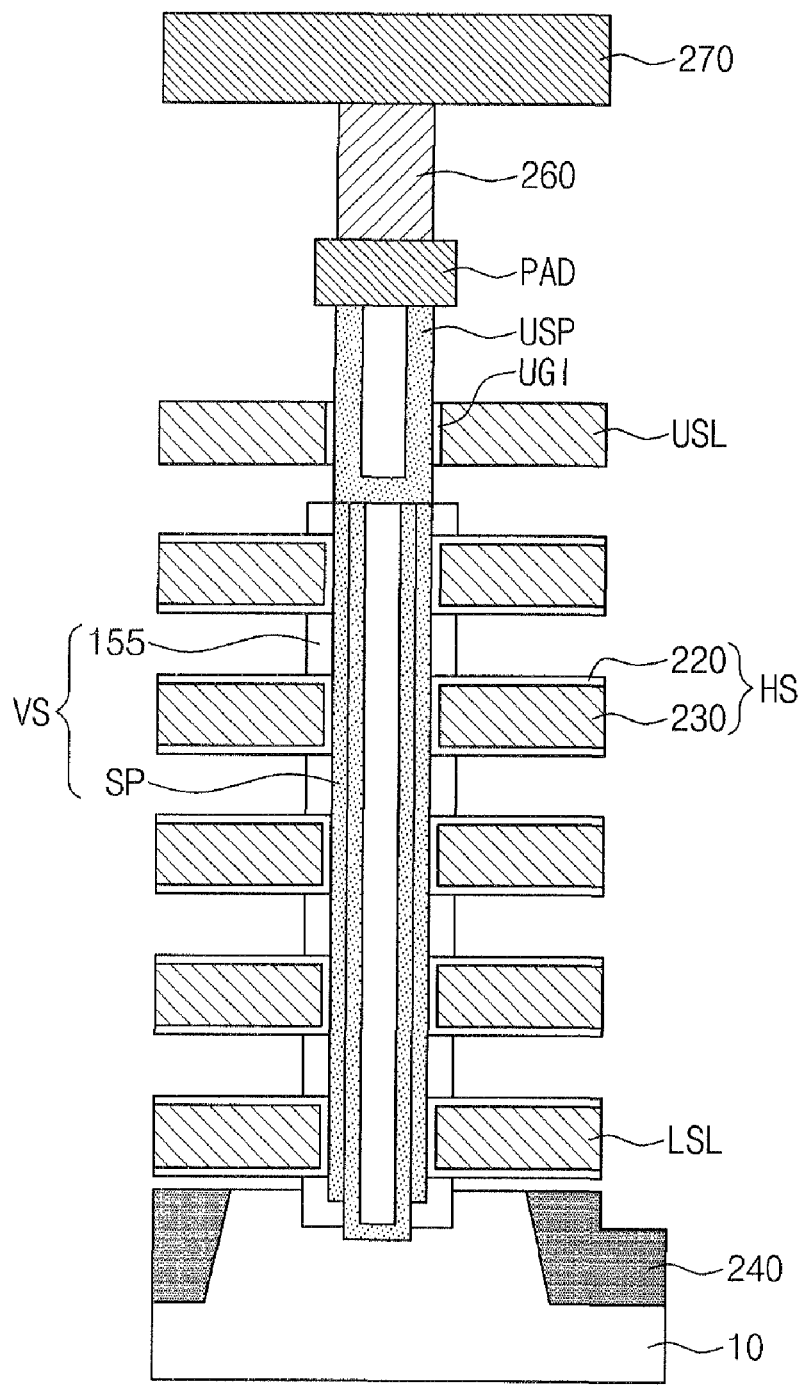

Referring to FIGS. 42 through 44, at least a single layer of upper select line USL is formed between the upper interconnection 270 and the horizontal structures HS. The upper select line USL is used as a gate electrode of an upper select transistor controlling a flow of current passing through the upper interconnection 270 and the semiconductor pattern SP. According to an embodiment, the upper select transistor may be a metal oxide semiconductor field effect transistor (MOSFET). According to an embodiment, as illustrated in FIG. 42, an upper gate insulating layer UGI may be interposed between the upper select line USL and the semiconductor pattern SP. To control the current flow, the upper select line USL may be formed in a direction of intersecting the upper interconnection 270 (e.g., in a direction parallel to the horizontal structure HS or the conductive pattern 230).

According to an embodiment, the upper select line USL may be formed using a different process from a process of forming the conductive pattern 230 constituting the horizontal structure HS. According to an embodiment, the upper select line USL and the conductive pattern 230 may be formed using the same process and may be thereby formed of the same material.

According to an embodiment, the upper gate insulating layer UGI may be formed using the same process as a process of forming one of the horizontal pattern 220 and the vertical pattern 155 and thus the upper gate insulating layer UGI may be formed to have substantially the same material and thickness as one of the horizontal pattern 220 and the vertical pattern 155. According to an embodiment, the upper gate insulating layer UGI may commonly include a thin layer constituting one of the horizontal pattern 220 and the vertical pattern 155. According to an embodiment, the upper gate insulating layer UGI may be independently formed from the horizontal pattern 220 and the vertical pattern 155 using a different manufacturing process.

As illustrated in FIGS. 43 and 44, the upper semiconductor pattern USP is disposed between the upper interconnection 270 and the semiconductor pattern SP, and the upper select line USL is formed around the upper semiconductor pattern USP. According to an embodiment, the upper semiconductor pattern USP may have the same conductivity type as the semiconductor pattern SP. According to an embodiment, a pad PAD may be further formed between the upper semiconductor pattern USP and the upper plug 260.

As illustrated in FIG. 44, at least a single layer of lower select line LSL is formed between the substrate 10 and the horizontal structures HS. A lower semiconductor pattern LSP is disposed between the substrate 10 and the semiconductor pattern SP, and the lower select line LSL is formed around the lower semiconductor pattern LSP. The lower select line LSL is used as a gate electrode of a lower select transistor controlling a flow of current passing through the impurity region 240 and the semiconductor pattern SP. A lower gate insulating layer LGI is interposed between the lower select line LSL and the lower semiconductor pattern LSP.

Figure 45:
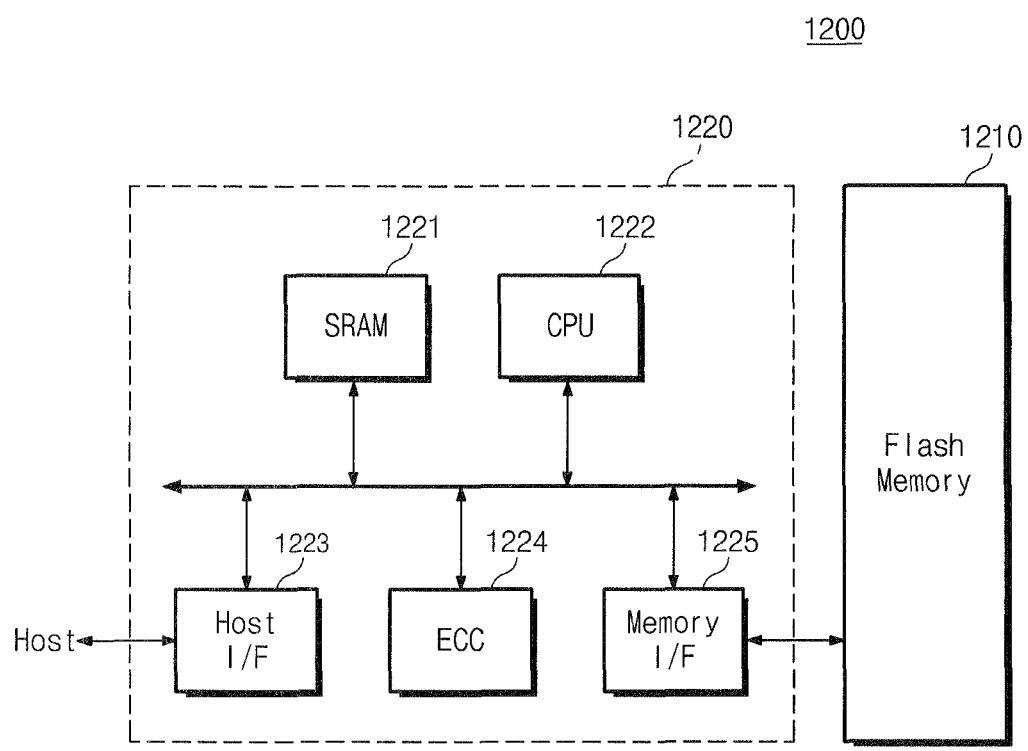
FIG. 45 is a block diagram illustrating an exemplary memory card including a flash memory device according to an embodiment of the inventive concept.

FIG. 45 is a block diagram illustrating an exemplary memory card including a flash memory device according to an embodiment of the inventive concept.

Referring to FIG. 45, the memory card 1200 for supporting a storage capability of large amounts of data includes a flash memory device 1210 according to an embodiment of the inventive concept. The memory card 1200 includes a memory controller 1220 that controls data exchanges between a host and the flash memory device 1210.

A SRAM 1221 is used as an operation memory of a processing unit 1222. A host interface 1223 includes data exchange protocols of a host connected to the memory card 1200. An error correction block 1224 detects and corrects errors included in data read out from a multi bit flash memory device 1210. A memory interface 1225 interfaces with the flash memory device 1210. A processing unit 1222 performs control operations for data exchanges of the memory controller 1220. According to an embodiment, the memory card 1200 according to the inventive concept may further include a ROM (not shown) that stores code data for interfacing with the host.

According to the embodiments of the present inventive concept, a memory card, or a memory system may provide high reliability due to improved dummy cell characteristics of the flash memory device 1210. For example, the flash memory device according to an embodiment of the inventive concept may be applicable to a memory system, such as a solid state disk (SSD), which may provide high reliability by preventing read errors caused by the dummy cells.

Figure 46:
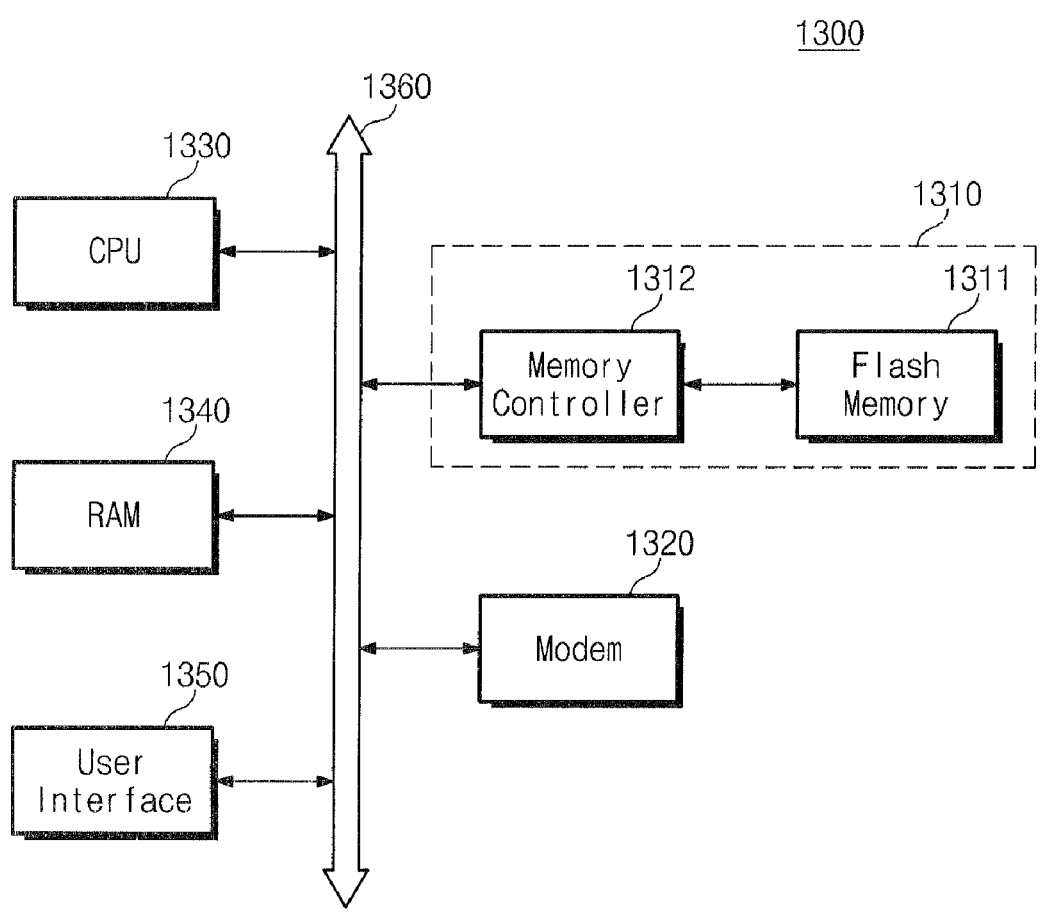
FIG. 46 is a block diagram illustrating a data processing system including a memory system according to an embodiment of the inventive concept.

FIG. 46 is a block diagram illustrating a data processing system including a memory system according to an embodiment of the inventive concept.

Referring to FIG. 46, a flash memory system 1310 according to an embodiment of the inventive concept is built in a data processing system, such as a mobile product or a desk top computer. A data processing system 1300 according to an embodiment of the inventive concept includes the flash memory system 1310, a modem 1320, a central processing unit (CPU) 1330, a random access memory (RAM) 1340, and a user interface 1350 that are electrically connected to a system bus 1360. The flash memory system 1310 is the same or substantially the same as the memory system or the flash memory system described above. The flash memory system 1310 stores data processed by the central processing unit 1330 or data received from an external device (not shown). According to an embodiment, the flash memory system 1310 may be a solid state disk (SSD) that can stably store huge amounts of data in the flash memory system 1310. With increased reliability, the flash memory system 1310 can reduce resources used to correct errors, thereby providing a high speed data exchange function to the data processing system 1300. According to an embodiment, the data processing unit 1300 according to an embodiment of the inventive concept may further include an application chipset, a camera image processor (CIS), and/or an input/output device.

The flash memory device or the memory system according to an embodiment of the inventive concept can be mounted in various types of packages, such as PoP (package on package), ball grid array (BGA), chip scale package (CSP), plastic leaded chip carrier (PICC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), or wafer-level processed stack package (WSP).

According to the embodiments of the inventive concept, a protective pattern prevents an outer surface of a plugging pattern, such as a charge storage layer or a semiconductor pattern from being damaged by etching. Accordingly, a technical problem, such as non-uniformity of a plugging pattern or an etching damage to a plugging pattern, and the accompanying product deterioration may be suppressed.

What is claimed is:

1. A method of manufacturing a three dimensional semiconductor device comprising:
    forming a first opening vertically penetrating mold layers and a sacrificial layer between the mold layers;
    sequentially forming a protective layer and a plugging layer on an inner wall of the first opening;
    forming a second opening vertically penetrating the mold layers and the sacrificial layer, the second opening being spaced apart from the first opening;
    forming a recess region exposing the protective layer by removing the sacrificial layer exposed by the second opening; and
    exposing the plugging layer by removing the protective layer exposed by the recess region.

2. The method of claim 1, wherein the sacrificial layer is formed of a material having an etch selectivity to the mold layers, and the protective layer is formed of a material having an etch selectivity to the sacrificial layer.

3. The method of claim 1, further comprising forming an intermediate pattern and a conductive pattern sequentially covering an exposed surface of the plugging layer.

4. A three dimensional semiconductor device manufactured by the method of claim 1, wherein a difference between a thickness of the plugging layer measured on a sidewall of the protective layer and a thickness of the plugging layer measured on a sidewall of the intermediate pattern is smaller than one tenth of an average thickness of the plugging layer.

5. The three dimensional semiconductor device of claim 4, wherein the protective layer and the mold layer are formed using different forming processes from each other, and wherein a discontinuous interface is formed between sidewalls of the protective layer and the mold layer.

6. A method of manufacturing a three dimensional semiconductor device comprising:
    forming a first opening in mold layers and sacrificial layers that are alternately arranged;
    sequentially forming a protective layer and a plugging layer on an inner wall of the first opening;
    forming a second opening in the mold layers and the sacrificial layer, wherein the second opening is spaced apart from the first opening;
    selectively removing the sacrificial layers to expose the protective layer; and
    selectively removing the protective layer to expose the plugging layer.

7. The method of claim 6, wherein selectively removing the sacrificial layers includes isotropically etching the sacrificial layers using an etch recipe having an etch selectivity to the mold layers and the protective layer.

8. The method of claim 7, wherein selectively removing the protective layer includes etching using an etch recipe having an etch selectivity to the plugging layer.

9. The method of claim 8, wherein the etch recipe has an etch selectivity to the mold layers.

10. The method of claim 7, wherein each of the mold layers includes a silicon oxide layer, and each of the sacrificial layers includes a silicon nitride layer, wherein the etching is performed using an etching solution including a phosphoric acid.

* * * * *